United States Patent
Lytle et al.

(10) Patent No.: US 6,340,897 B1
(45) Date of Patent: *Jan. 22, 2002

(54) PROGRAMMABLE LOGIC ARRAY INTEGRATED CIRCUIT WITH GENERAL-PURPOSE MEMORY CONFIGURABLE AS A RANDOM ACCESS OR FIFO MEMORY

(75) Inventors: Craig S. Lytle, Mountain View; Donald F. Faria, San Jose, both of CA (US)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/481,781

(22) Filed: Jan. 11, 2000

Related U.S. Application Data

(63) Continuation of application No. 08/707,705, filed on Jul. 24, 1996, now Pat. No. 6,049,223, which is a continuation-in-part of application No. 08/408,510, filed on Mar. 22, 1995, now Pat. No. 5,572,148.

(51) Int. Cl.[7] .............................................. H03K 19/177
(52) U.S. Cl. ............................. 326/40; 326/39; 326/41
(58) Field of Search ................................. 326/38, 39, 40, 326/41; 365/221

(56) References Cited

U.S. PATENT DOCUMENTS

| | | | |
|---|---|---|---|
| 4,198,744 A | 4/1980 | Nicolay | 29/623 |
| 4,293,783 A | 10/1981 | Patil | 326/40 |
| 4,441,167 A | 4/1984 | Principi | 365/94 |
| 4,617,479 A | 10/1986 | Hartmann et al. | 307/465 |
| 4,670,749 A | 6/1987 | Freeman | 340/825.85 |
| 4,706,216 A | 11/1987 | Carter | 365/94 |
| 4,780,846 A | 10/1988 | Tanabe et al. | 365/63 |
| 4,825,414 A | 4/1989 | Kawata | 365/189 |
| 4,831,591 A | 5/1989 | Imazeki et al. | 365/189.08 |

(List continued on next page.)

FOREIGN PATENT DOCUMENTS

| | | |
|---|---|---|
| EP | 0081917 | 8/1983 |
| EP | 0410759 A2 | 1/1991 |
| EP | 0415542 A2 | 3/1991 |

(List continued on next page.)

OTHER PUBLICATIONS

Matsumoto, Rodney T., "Configurable On–Chip RAM Incorporated into Hign Speed Logic Array," IEEE Custom Integrated Circuits Conference, Jun. 1985, CH2157–6/85/0000–0240, pp. 240–243.

Landry, Steve, "Application–Specific ICs, Relying on RAM, Implement Almost Any Logic Function," Electronic Design, Oct. 31, 1985, pp. 123–130.

Bursky, Dave, "Shrink Systems with One–Chip Decoder, EPROM, and RAM," Electronic Design, Jul. 28, 1988, pp. 91–94.

Kawana, Keiichi et al., "An Efficient Logic Block Interconnect Architecture for User–Reprogrammable Gate Array," IEEE 1990 Custom Integrated Circuits Conference, May 1990, CH2860–5/90/0000–0164, pp. 31.3.1–4

(List continued on next page.)

*Primary Examiner*—Michael Tokar
*Assistant Examiner*—Steven S. Paik
(74) *Attorney, Agent, or Firm*—Townsend and Townsend and Crew LLP

(57) ABSTRACT

A programmable logic device integrated circuit incorporating a memory block. The memory block (250) is a general-purpose memory configurable as a random access memory (RAM) or a first-in first-out (FIFO) memory. In one embodiment, the organization of memory block (250) may have variable word size and depth size. Memory block (250) is coupled to a programmable interconnect array (213). Signals from the programmable interconnect array (213) may be programmably coupled to the data, address, and control inputs of the memory block. Data output and status flag signals from the memory block are programmably coupled to the programmable interconnect array (213).

52 Claims, 13 Drawing Sheets

U.S. PATENT DOCUMENTS

| | | | |
|---|---|---|---|
| 4,855,958 A | 8/1989 | Ikeda | 365/230.08 |
| 4,891,788 A | 1/1990 | Kreifels | 365/49 |
| 4,940,909 A | 7/1990 | Mulder et al. | 307/468 |
| 4,963,770 A | 10/1990 | Keida | 307/465 |
| 4,975,601 A | 12/1990 | Steele | 326/39 |
| 5,042,004 A | 8/1991 | Agrawal et al. | 364/900 |
| 5,122,685 A | 6/1992 | Chan et al. | 307/465.01 |
| RE34,363 E | 8/1993 | Freeman | 307/465 |
| RE34,444 E | 11/1993 | Kaplinsky | 340/825.8 |
| 5,260,610 A * | 11/1993 | Pedersen et al. | 326/41 |
| 5,260,727 A | 11/1993 | Oksman et al. | 351/162 |
| 5,274,600 A * | 12/1993 | Ward et al. | 365/221 |
| 5,313,119 A | 5/1994 | Cooke et al. | 326/41 |
| 5,315,178 A | 5/1994 | Snider | 307/465 |
| 5,329,460 A | 7/1994 | Agrawal et al. | 364/489 |
| 5,343,406 A | 8/1994 | Freeman et al. | 364/490 |
| 5,352,940 A | 10/1994 | Watson | 307/468 |
| 5,406,525 A | 4/1995 | Nicholes | 365/230.02 |
| 5,408,434 A | 4/1995 | Stansfield | 365/189.08 |
| 5,414,377 A | 5/1995 | Freidin | 326/41 |
| 5,426,378 A | 6/1995 | Ong | 326/41 |
| 5,432,719 A | 7/1995 | Freeman et al. | 364/579 |
| 5,469,003 A * | 11/1995 | Kean | 326/39 |
| 5,530,378 A * | 6/1996 | Kucharewski, Jr. et al. | 326/41 |
| 5,550,782 A * | 8/1996 | Cliff et al. | 365/230.03 |
| 5,566,123 A | 10/1996 | Freidin et al. | 365/230.08 |
| 5,570,040 A * | 10/1996 | Lytle et al. | 326/41 |
| 5,572,148 A * | 11/1996 | Lytle et al. | 326/41 |
| 5,668,771 A | 9/1997 | Cliff et al. | 365/230.03 |
| 5,809,281 A | 9/1998 | Steele et al. | 395/497.01 |
| 5,835,405 A | 11/1998 | Tsui et al. | 365/182 |
| 6,049,223 A * | 4/2000 | Lytle et al. | 326/40 |

FOREIGN PATENT DOCUMENTS

| | | |
|---|---|---|
| EP | 0420389 A1 | 4/1991 |
| EP | 0507507 A2 | 10/1992 |
| EP | 0530985 A2 | 3/1993 |
| EP | 0569137 A2 | 11/1993 |
| JP | 01091525 A | 4/1989 |
| JP | 01091526 A | 4/1989 |
| WO | WO 94/10754 | 5/1994 |
| WO | WO 95/16993 | 6/1995 |

OTHER PUBLICATIONS

Plus Logic "FPSL5110 Intelligent Data Buffer" Product Brief, Plus Logic, Inc., San Jose, California, Oct. 1990, pp. 1–6.

Shubat, Alexander et al., "A Family of User–Programmable Peripherals with a Functional Unit Architecture," IEEE Jor. of Solid–State Circuits, vol. 27, No. 4, Apr. 1992, 0018–9200/92$03.00, pp. 515–529.

"AT&T's Orthogonal ORCA Targets the FPGA Future," 8029 Electronic Engineering, 64, No. 786, Jun. 1992, Woolwich, London, GB, pp. 9–10.

Bursky, Dave, "FPGA Advances Cut Delays, Add Flexibility," 2328 Electronic Design, 40, No. 20, Oct. 1, 1992, Cleveland, OH, pp. 35–43.

Smith, Daniel, "Intel's FLEXlogic FPGA Architecture," IEEE 1063–6390/93, Wilton [29], 1993 pp. 378–384.

Bursky, Dave, "Denser, Faster FPGAs Vie for Gate–Array Applications," 2328 Electronic Design, 41, No. 11, May 27, 1993, Cleveland, OH, pp. 55–75.

Ngai, Kai–Kit Tony, "An SRAM–Programmable Field–Reconfigurable Memory," UMI Dissertation Services, Jun. 1994, University of Toronto, pp. i–68.

Bursky, D. "Combination RAM/PLD Opens New Application Options" (1991) *Electronic Design,* May 23, 1991, pp. 138–140.

Plus Logic, "FPSL5110 Intelligent Data Buffer" Data Sheet, pp. 1–3.

Xilinx XC4000, "The Programmable Logic Data Book", 1994, pp. 2–7 through 2–46.

MAX 5000, Altera Data Book, Aug. 1993, pp. 149–160.

"Implementing FIFO Buffers in FLEX 10K Devices", Altera Corporation, Jan. 1996, Ver. 1, Application Note 66, pp. 1–12.

"Configuring FLEX 10K Devices", Altera Corporation, Dec. 1995, Ver. 1, Application NOte 59, pp. 1–24.

"Flex 10K Embedded Programmable Logic Family", Altera Corporation, Jul. 1995, Ver. 1, Data Sheet, pp. 1–56.

"Implementing RAM Functions in FLEX 10K Devices", Altera Corporation, Nov. 1995, Ver. 1, Application Note 52, pp. 1–8.

Lattice Semiconductor Corporation Product News Release, Mar. 4, 1996.

Lattice Semiconductor Corporation Data Sheet, Jan., 1996.

Bursky, D. "CPLDs Add Dedicated Memory, Counters To Up Performance,", Mar. 4, 1996.

Nelson, "Embedded Memory Enhances Programmable Logic for Complex, Compact Designs," EDN Magazine, Nov. 7, 1996, pp. 91–106.

Kautz, "Cellular Logic in Memory Arrays," IEEE Trans. on Computers, vol. C–18, No. 8, Aug. 1969, pp. 719–727.

Stone, "A Logic in Memory Computer," IEEE Trans. on Computers, Jan. 1970, pp. 73–78.

Manning, "An Approach to Highly Integrated Computer Maintained Cellular Arrays," IEEE Trans. on Computers, vol. C–26, No. 6, Jun. 1977, pp. 536–552.

Patil et al., "A Programmable Logic Approach for VLSI," IEEE Trans. on Computers, vol. C–28, No. 9, Sep. 1979, pp. 594–601.

Seitz, "Concurrent VLSI Architectures," IEEE Trans. on Computers, vol. C–33, No. 12, Dec. 1984, pp. 1247–1265.

Hsieh et al., "Third Generation Architecture Boosts Speed and Density of Filed Programmable Gate Arrays," Proc. of IEEE CICC Conf., May 1990, pp. 31.2.1 to 31.2.7.

Bursky, "Combination RAM/PLD Opens New Application Options," Electronic Design, May 23, 1991, pp. 138–140.

Ling et al., "WASMII: A Data Driven Computer on a Virtual Hardware," Proc. of IEEE Field Prog. Custom Computing Machines Conf., Napa, California, Apr. 1993, pp. 33–42.

Casselman, "Virtual Computing and The Virtual Computer," IEEE, Jul. 1993, p. 43.

Quenot et al., "A Reconfigurable Compute Engine for Real––Time Vision Automata Prototyping," Proc. of IEEE FCCM Conf., Napan, California, Feb. 1994, pp. 91–100.

Larsson, T, "Programmable Logic Circuits: The Luxury Alternatives are Coming Soon," Elteknik–med–Aktuell Electronik, No. 4, Feb. 25–Mar. 9, 1988, pp. 37–38, (with English abstract).

Intel Prelininary Datasheet, "iFX780: 10ns FLEXlogic FPGA with SRAM Option," Nov. 1993, pp. 2–24 to 2–46.

Quinnell, Richard A., "FPGA Family Offers Speed, Density, On–Chip RAM, and Wide–Decode Logic," EDN Dec. 6, 1990, pp. 62–63.

Satoh, Hisayasu et al., "A 209K–Transistor ECL Gate Array with RAM," IEEE Jor. of Solid–State Circuits, vol. 24, No. 5, Oct. 1989, pp. 1275–1279.

* cited by examiner

I/O Control Block

The decoupled I/O control block features dual feedback to maximize flexibility of device pins.

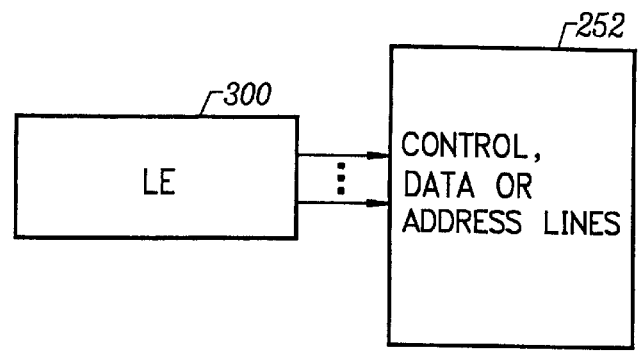
FIG. 4A
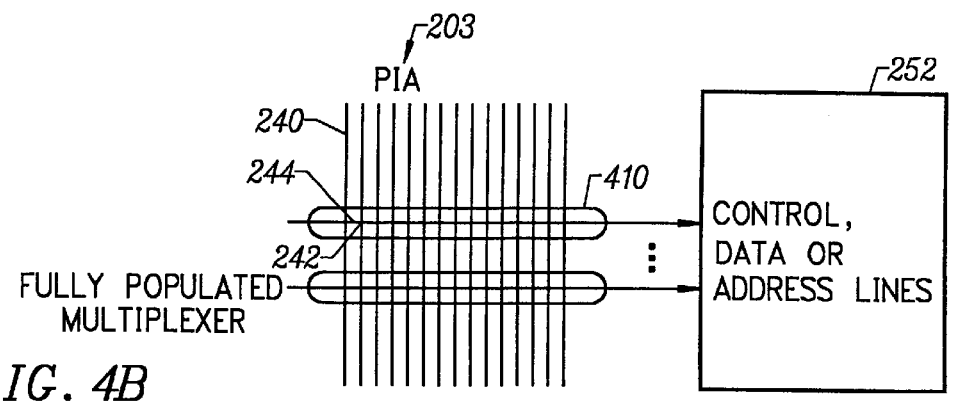
FIG. 4B
FIG. 4C
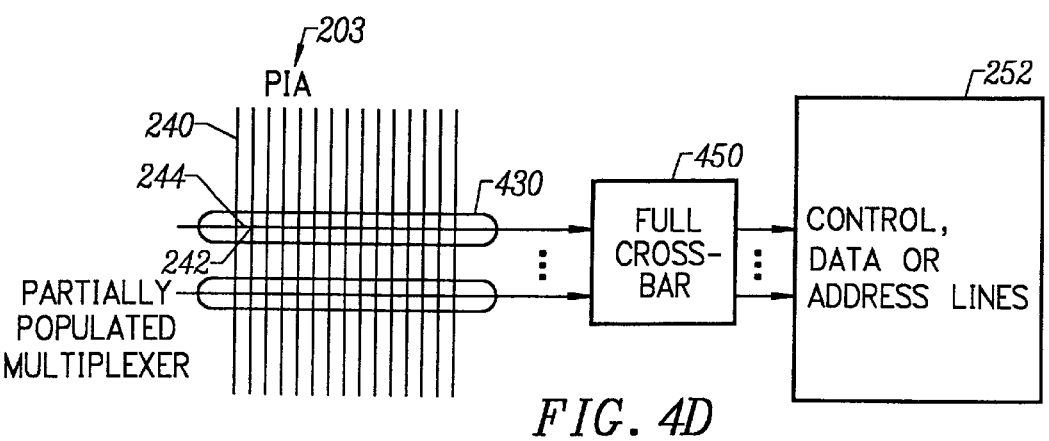
FIG. 4D

PROGRAMMABLE LOGIC ARRAY INTEGRATED CIRCUIT WITH GENERAL-PURPOSE MEMORY CONFIGURABLE AS A RANDOM ACCESS OR FIFO MEMORY

This application is a continuation of U.S. patent application Ser. No. 08/707,705, filed Jul. 24, 1996 (which issued as U.S. Pat. No. 6,049,223) which is a continuation-in-part of U.S. patent application Ser. No. 08/408,510 filed Mar. 22, 1995 (which issued as U.S. Pat. No. 5,572,148), both of which are incorporated by reference into this application in their entirety for all purposes.

BACKGROUND OF THE INVENTION

The present invention relates to the field of programmable logic integrated circuits. More specifically, the present invention provides an enhanced programmable logic architecture, improving upon the composition, configuration, and arrangements of logic array blocks and logic elements and also the interconnections between these logic array blocks and logic elements.

Programmable Logic Devices (PLDs) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, MAX® 7000, and FLEX® 8000 EPLDs made by Altera Corp.

PLDs are generally known in which many logic array blocks (LABs) are provided in a two-dimensional array. Further, PLDs have an array of intersecting signal conductors for programmably selecting and conducting logic signals to, from, and between the logic array blocks. These conductors may be organized into an interconnect bus, which may be referred to as a programmable interconnect array (PIA), global horizontal interconnect (GHs), or global vertical interconnects (GVs). LABs contain a number of programmable logic elements (LEs) or macrocells which provide relatively elementary logic functions such as NAND, NOR, and exclusive OR. LEs also provide sequential or registered logic functions.

Resulting from the continued scaling and shrinking of semiconductor device geometries, which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks. In particular, it is important to provide enough interconnection resources between the programmable logic elements so that the capabilities of the logical elements can be fully utilized and so that complex logic functions (e.g., requiring the combination of multiple LABs and LEs) can be performed, without providing so much interconnection resources that there is a wasteful excess of this type of resource.

While such devices have met with substantial success, such devices also meet with certain limitations, especially in situations in which the provision of additional or alternative types of interconnections between the logic modules would have benefits sufficient to justify the additional circuitry and programming complexity. Such additional interconnection paths may be desirable for making frequently needed kinds of interconnections, for speeding certain kinds of interconnections, for allowing short distance connections to be made without tying up a more general-purpose interconnection resource such as long-distance interconnect. There is also a continuing demand for logic devices with larger capacity. This produces a need to implement logic functions more efficiently and to make better use of the portion of the device which is devoted to interconnecting individual logic modules.

As can be seen, an improved programmable logic array integrated circuit architecture is needed, especially an architecture providing additional possibilities for interconnections between the logic modules and improved techniques for organizing and interconnecting the programmable logic elements, including LABs and LEs.

SUMMARY OF THE INVENTION

The present invention is a programmable logic device integrated circuit incorporating a memory block. The memory block may be, but not limited to, a RAM, FIFO, or other memory, and combinations of these. In an embodiment, the memory block is a general-purpose memory configurable as a random access memory (RAM) or a first-in first-out (FIFO) memory. Further, the organization of memory block may have variable word size and depth size. The memory block is coupled to a programmable interconnect array. Signals from the programmable interconnect array may be programmably coupled to the data, address, control inputs, and other inputs of the memory block. Data output and status flag signals from the memory block may be programmably coupled to the programmable interconnect array. Signals between the various PLD components and the memory block may be interconnected via the programmable interconnect array.

In particular, the present invention is a programmable logic array integrated circuit including a first plurality of conductors, extending along a first dimension of a two-dimensional array; a second plurality of conductors, extending along a second dimension of the two-dimensional array, where the second plurality of conductors is programmably coupled to the first plurality of conductors; a plurality of logic array blocks, programmably coupled to the first plurality of conductors and second plurality of conductors; and a memory block, programmably coupled to the first plurality of conductors and the second plurality of conductors. Furthermore, the memory block is programmably configurable as a random access memory in a first mode and a first-in, first-out memory in a second mode. In a further embodiment, a word size and a depth size for the memory block are programmably selectable.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 4A is a diagram showing interconnections between a logic element of a logic array block and a memory block of the programmable logic device integrated circuit;

FIG. 4B is a diagram showing interconnections between a programmable interconnect array and a memory block of the programmable logic device integrated circuit using fully populated multiplexing;

FIG. 4C is a diagram showing interconnections between a programmable interconnect array and a memory block of the programmable logic device integrated circuit using partially populated multiplexing;

FIG. 4D is a diagram showing interconnections between a programmable interconnect array and a memory block of the programmable logic device integrated circuit using partially populated multiplexing and crossbar;

DETAILED DESCRIPTION OF THE PREFERRED EMBODIMENTS

Figure 1:
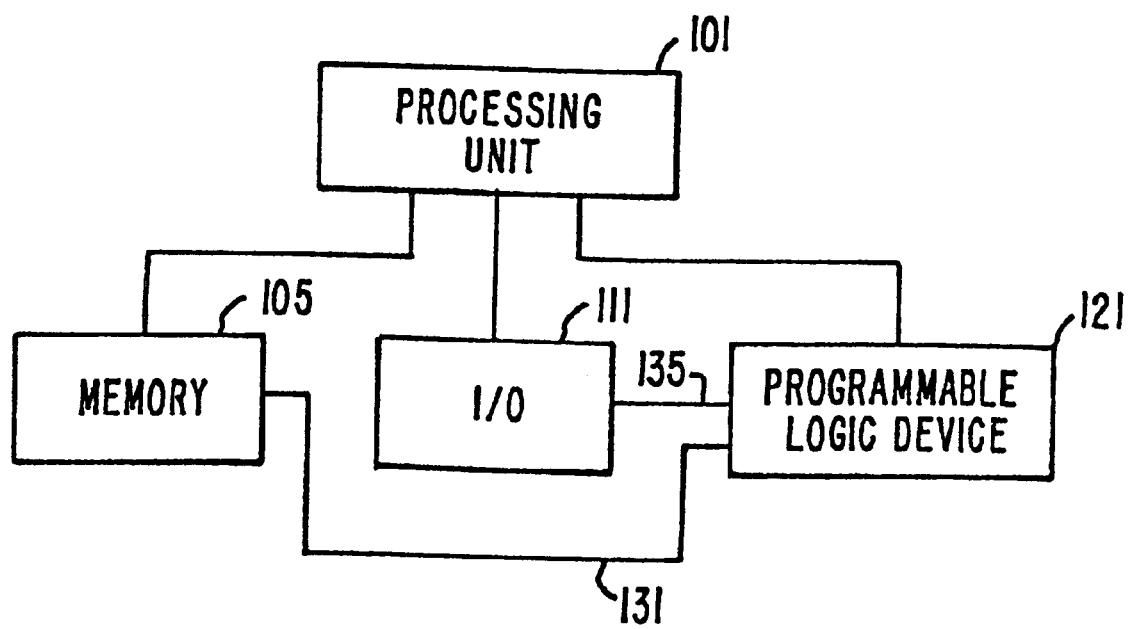
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105, an I/O 111, and a programmable logic device (PLD) 121. PLD 121 is coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. In some embodiments, processing unit 101 may even be a computer system.

In one embodiment, source code may be stored in memory 105, compiled into machine language, and executed by processing unit 101. In the alternative, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of programmed digital computer 101, supporting its internal and external operations. PLD 121 is programmed to implement the logical functions necessary to carry on its particular role in system operation.

As some examples of the multitude of uses for PLD 121, programmed digital computer 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown directly coupled to PLD 121. However, in other embodiments, a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
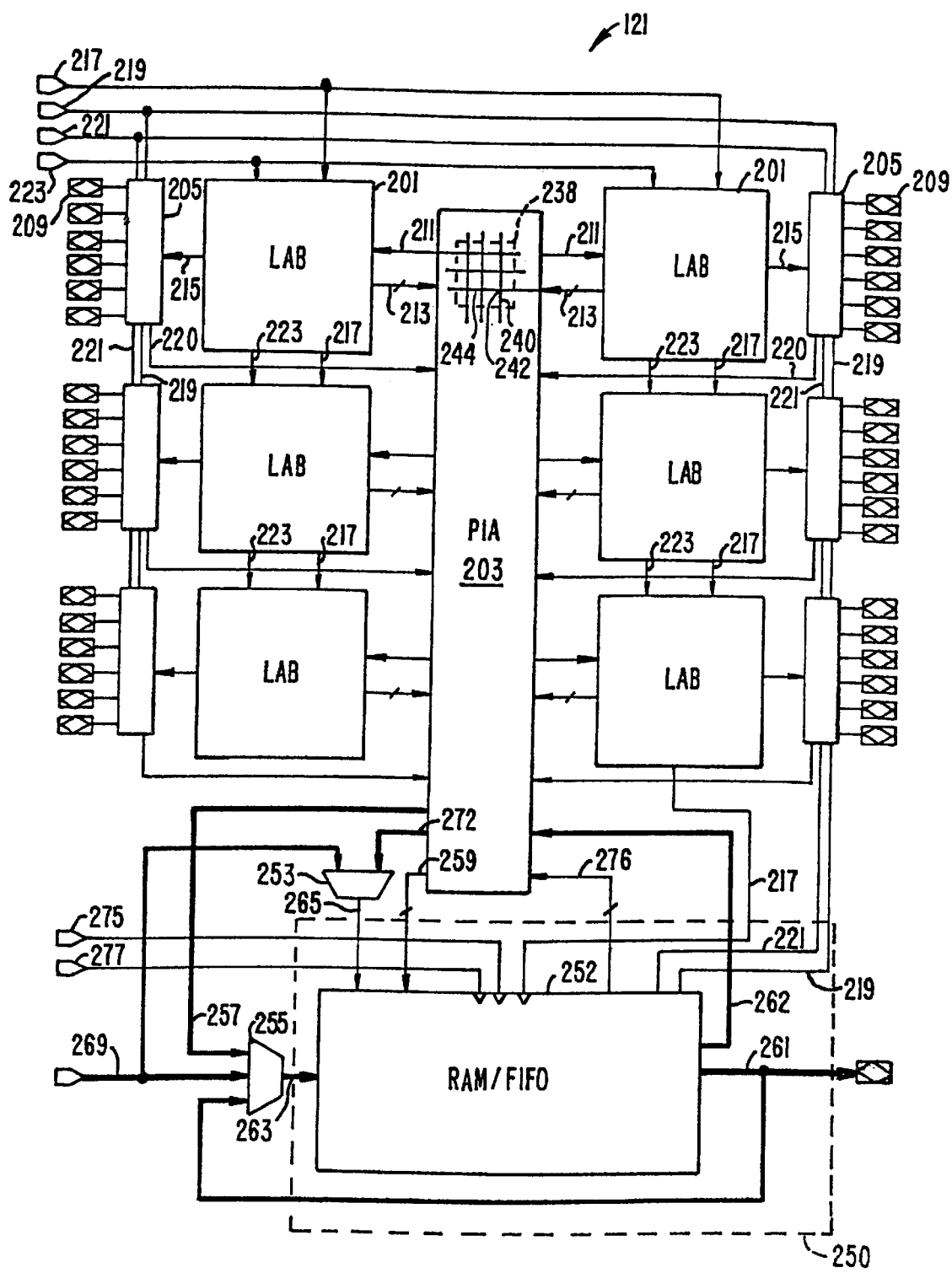
FIG. 2 is a block diagram a programmable logic device integrated circuit of the present invention.

FIG. 2 is a block diagram of the overall internal architecture and organization of PLD 121 of FIG. 1. Many details of PLD architecture, organization, and circuit design are not necessary for an understanding of the present invention and such details are not shown in FIG. 2. PLD 121 includes, among other components, an array of logic array blocks (LABS) 201, a programmable interconnect array (PIA) 203, a memory block 250 (shown in a dashed box), input-output blocks 205, and input-output pads 209.

In the particular embodiment shown in FIG. 2, PLD 121 includes a two-dimensional array of LABs 201, arranged in two columns of three LABs 201 for a total of six LABs. LAB 201 is a physically grouped set of logical resources that is configured or programmed to perform logical functions. The internal architecture of a LAB will be described in more detail below in connection with FIG. 3. PLDs may contain any arbitrary number of LABs, more or less than PLD 121 shown in FIG. 2. Generally, in the future, as technology advances and improves, programmable logic devices with even greater numbers of LABs will undoubtedly be created. Furthermore, LABs 201 need not be organized as shown in FIG. 2; for example, the array may be organized in a five-by-seven or a twenty-by-seventy matrix of LABs.

LABs 201 are connected to PIA 203 through inputs 211 and outputs 213. PIA 203 is a programmable or global interconnect array that facilitates the combination of multiple LABs 201 (and other components in the PLD) to form more complex, larger logic functions than can be realized using a single LAB 201. A very simplified view of PIA 203 is provided in dashed box 238. In this embodiment, PIA 203 is a two-dimensional array of conductors for routing signals between different LABs 201. A plurality of horizontal conductors 244 extends in a first direction, coupling to inputs 211 and outputs 213 of LABs 201. A plurality of vertical conductors 240 extends in a second direction, spanning the length of the PLD. The horizontal and vertical conductors are programmably connectable at intersections 242 of these conductors. Using PIA 203, a LAB 201 in one location on the PLD may be programmably coupled to another LAB 201 in another location on the PLD.

PIA 203 may be implemented using many memory technologies. PIA may be constructed from programmable memory technologies such as, among others, dynamic random access memory (DRAM), static random access memory (SRAM), erasable read only memory (EPROM), fuses, and antifuses. In a specific embodiment, PIA 203 is implemented using electrically erasable programmable read only memory (EEPROM) cells or Flash EEPROM cells.

As discussed above, a PLD may contain more columns (and rows) of LABs than shown in FIG. 2. This type of architecture is exemplified by Altera's Flex® series of products. In such circumstances, there may also be a PIA extending in a horizontal direction, analogous to PIA 203 which extends in a vertical direction. PIAs in the horizontal direction may be referred to as global horizontal interconnects (GHs), and when in the vertical direction, global vertical interconnects (GVs). In Altera's devices, these are sometimes referred to as Horizontal FastTracks™ and Vertical FastTracks™, and also as row and column interconnects. PIAs, GHs, and GVs provide an efficient technique of grouping and organizing the interconnection resources of the PLD.

There may be any number of GHs and GVs in a PLD, and each GH and GV may contain a plurality of individual conductors. For example, a PLD architecture may include three rows and three columns of LABs, where each row is separated by a GH and each column is separated by a GV. In FIG. 2, signals from LABs 201 are coupled to I/O block 205. However, in other embodiments of the present invention, signals from LABs 210 may be programmably coupled through GHs and GVs to an appropriate I/O block 205. For example, these signals may pass directly to an I/O block 205 from the GH or GV, without needing to pass through another LAB 201.

The inputs and outputs to the LABs will be programmably connectable to the GHs and GVs in a similar fashion as described for PIA 203 above. Furthermore, at intersections of GHs and GVs, signal may be programmably coupled to another. For example, a signal may be programmable coupled from a LAB to a GV conductor and then to a GH conductor to another LAB in a different column. Furthermore, GHs and GVs conductors may be used to make multiple connections to other GHs, GVs, LABs, and I/O blocks. Utilizing GHs and GVs, multiple LABs 201 may be connected and combined to implement larger, more complex logic functions.

In still further embodiments of the present invention, using GHs and GVs, signals from a LAB 201 can be fed back into the same LAB 201. Selected GH conductors may only be programmably connectable to a selection of GV conductors. GH 210 and GV 220 conductors may be specifically used for passing signal in a specific direction, such as input or output, but not both. As can be appreciated, there are many other embodiments of the interconnection resources of the present invention.

Figure 3A:
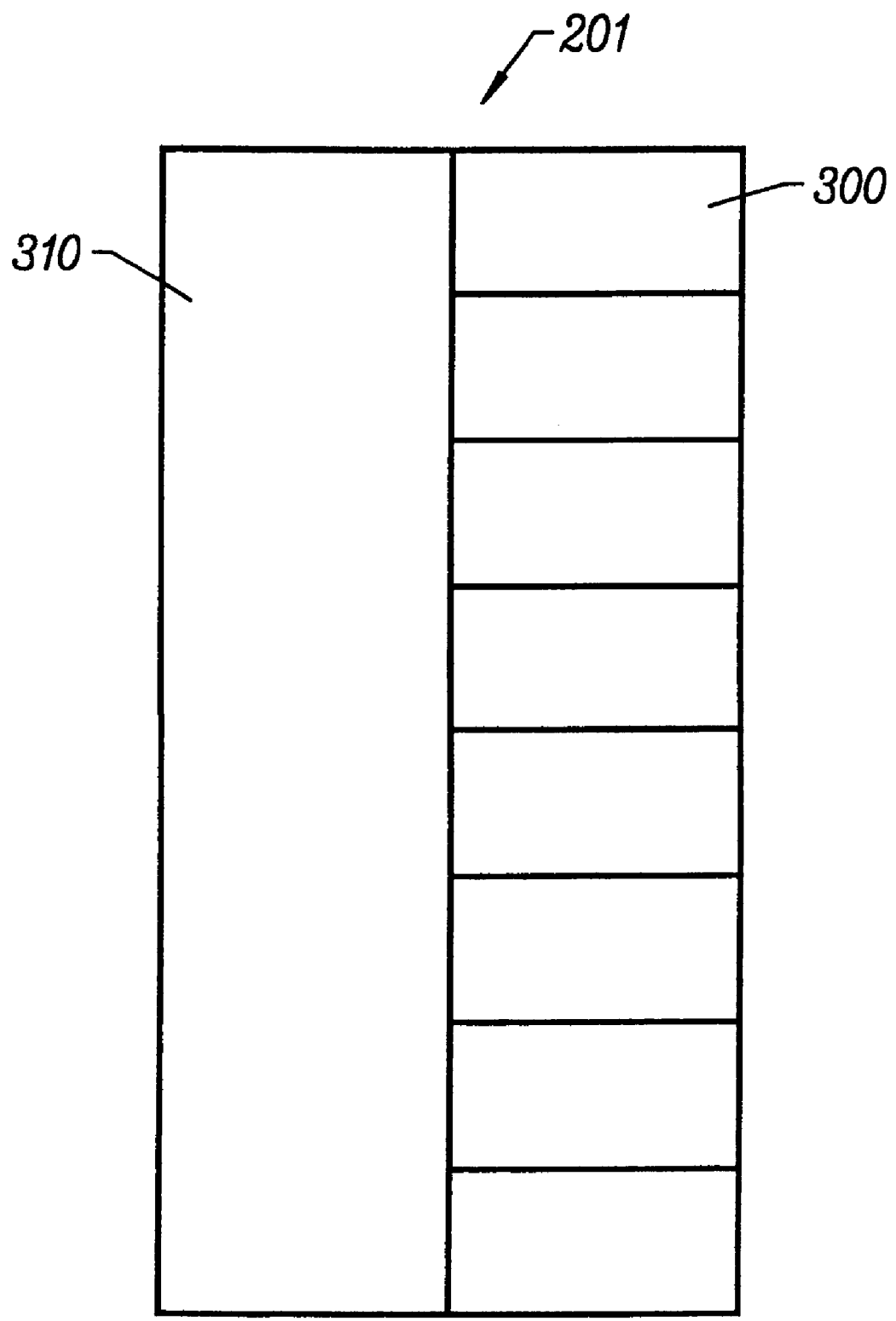
FIG. 3A is a more detailed block diagram of a logic array block of the programmable logic device integrated circuit of FIG. 2.

FIG. 3A shows a simplified block diagram of LAB 201 of FIG. 2. LAB 201 is comprised of a varying number of logic elements (LEs) 300, sometimes referred to as "logic cells," and a local (or internal) interconnect structure 310. Local interconnect structure 310 may be optionally included depending on the functionality desired for the PLD architecture. For example, the LEs may be programmably coupled directly to the PIA, without using a local interconnect structure 310.

LAB 201 has eight LEs 300, but in further embodiments, LAB 201 may have any number of LEs, more or less than eight. In another embodiment of the present invention, LAB 201 has two "banks" of eight LEs for a total of sixteen LEs, where each bank has separate inputs, outputs, control signals, and carry chains.

A general overview of LE 300 is presented here, sufficient to provide a basic understanding of LAB 201 and the present invention. LE 300 is the smallest logical "user-desired" building block of a PLD. LE 300 is sometimes referred to as a "macrocell." LE 300 is configured to perform "user desired" logical functions. Signals external to the LAB, such as from PIA 203 are programmably connected to LE 300 and through local interconnect structure 310. Furthermore, in some PLD architectures, external signals from dedicated inputs may also be programmably coupled to LE 300.

In one embodiment, LE 300 of the present invention incorporates a logical function generator that is configurable to provide a logical function of a number of variables, such a four-variable Boolean operation. Within LABs and LEs, many other techniques may be used for providing logic functions including, but not limited to, function generators, look-up tables, AND-OR arrays, product terms, multiplexers, and a multitude of other techniques. As well as combinatorial functions, LE 300 also provides support for sequential and registered functions using, for example, D flip-flops, T flip-flops, S-R flip-flips, J-K flip-flops, counters, up-down counters, registers, register files, accumulators, and many others.

LE 300 provides combinatorial and registered outputs that are connectable to PIA 203 and input-output blocks 205, outside LAB 201. Furthermore, in one embodiment, the outputs from LE 300 may be internally fed back into local interconnect structure 310; through local interconnect structure 310, an output from one LE 300 may be programmably connected to the inputs of other LEs 300, without using the global interconnect structure, PIA 203.

Local interconnect structure 310 allows short-distance interconnection of LEs, without utilizing the limited global resources, PIA 203. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

There are many other techniques and architectures for implement logic in a PLD. Such architectures and devices are currently represented by, for example, Altera's MAX® series of PLDs and FLEX® series of PLDs. The former are described in, for example, U.S. Pat. Nos. 5,241,224 and 4,871,930, and the *Altera Data Book*, March 1995, all incorporated herein by reference. The latter are described in, for example, U.S. Pat. Nos. 5,258,668, 5,260,610, 5,260,611 and 5,436,575, the *Altera Data Book*, March 1995, and the *Flex* 8000 *Handbook*, May 1994, all incorporated herein by reference for all purposes. For example, other embodiments of LABs, LEs, macrocells, and interconnections between PIA 203 and the macrocells are shown in FIGS. 3B to 3F, and are only briefly described here.

Figure 3B:
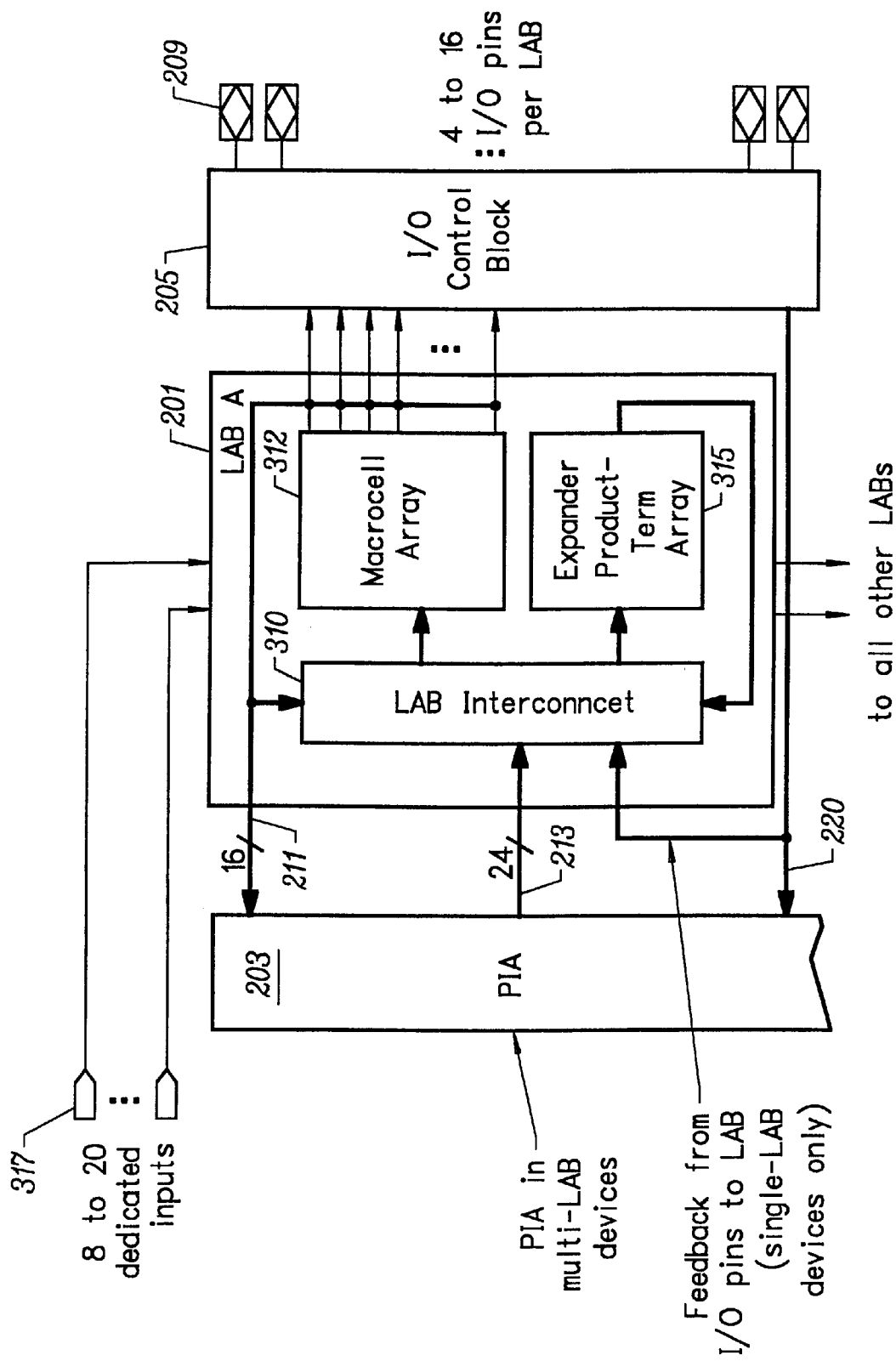
FIG. 3B is a diagram of an embodiment of a logic array block for the programmable integrated circuit of FIG. 2.

LAB 201 of FIG. 3B includes a macrocell array 312, LAB interconnect 310, and expander product-term array 315. FIG. 3B shows the various interconnections between PIA 203 and LAB 201. For example, dedicated inputs 317 input external signals into LAB 201. PIA 213 also inputs signals from other devices coupled to PIA 213 into the LAB. Macrocell 312 is a resource for logic implementation. Additional local capability is available from expanders 315, which can be used to supplement the capabilities of the macrocell 312. The expander product-term array 315 includes a group of unallocated, inverted product terms that can be used and shared by macrocells 312 in LAB 201 to create combinatorial and registered logic. These flexible macrocells 312 and shareable expanders 315 facilitate variable product-term designs without the inflexibility of fixed product term architectures. Macrocell output may be routed via LAB interconnect 310, and also via PIA 203.

Figure 3C:
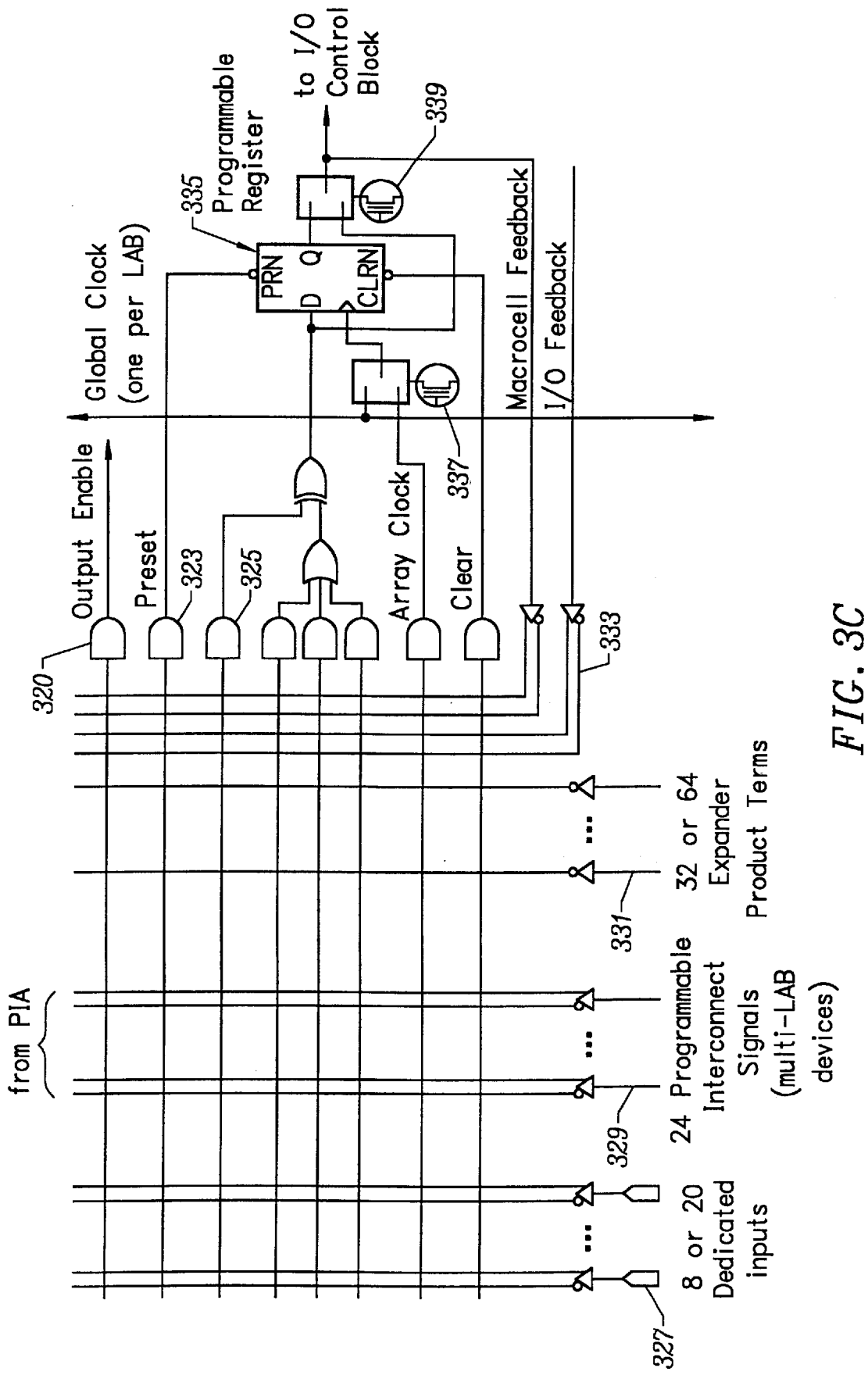
FIG. 3C is a diagram of a macrocell of the logic array block of FIG. 3B.

FIG. 3C shows an individual macrocell of macrocell array 312 of FIG. 3B. A macrocell is analogous to an LE 300 of FIG. 3A. One or more of these macrocells may form macrocell array 312. This is an AND-OR array macrocell. Product terms are provided to programmably implement logical functions. For example, there is an output enable product term 320 and preset product term 323. Other product terms such as product term 325 may be used to implement AND-OR logic. Product terms are programmably configured to AND one or more inputs feeding into the macrocell. For example, inputs to an AND gate are programmably coupled to the desired input signals. An AND result of these inputs is coupled to the appropriate and desired component in the macrocell. Logical inputs into this macrocell may come from dedicated inputs 327, inputs 329 from PIA 203 (and LAB interconnect 310), and expander inputs 331 from expanders 315. Also, feedback terms 333 feeding back from input-output block 205, as well as from the macrocell itself, may also be used to provide inputs.

This macrocell includes a register 335 for registered logic. A programmable clock multiplexer selects, by way of programmable bit 337, whether register 335 is clocked using an array clock (e.g., from PIA 203) or a global clock. Output from the macrocell is programmably selected by way of programmable bit 339, to select a combinatorial output from an OR gate, or a registered output from register 335.

Figure 3D:
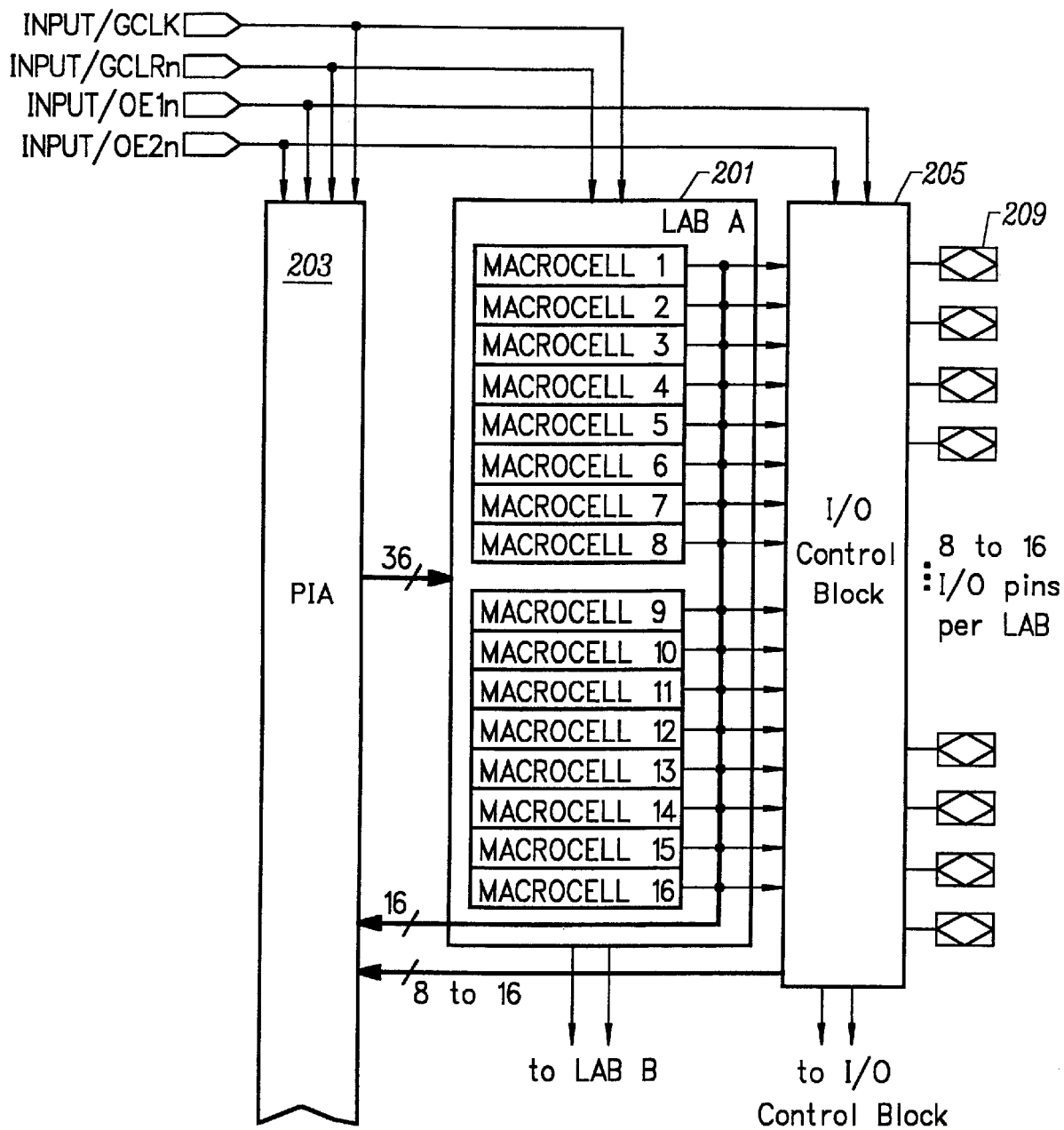
FIG. 3D is a diagram of an embodiment of a logic array block for the programmable integrated circuit of FIG. 2.

FIG. 3D shows another LAB 201 implementation and its interconnections to PIA 201 and other components of the PLD. A GCLK input couples to LAB 201 to provide a global clock signal. A GCLRn input couples to LAB 201 to provide a global clear. An OE1n input and an OE2n input provides global output enable signals to input-output block 205. LAB 201 is comprised of macrocells, an example of which is shown in more detail in FIG. 3E.

Figure 3E:
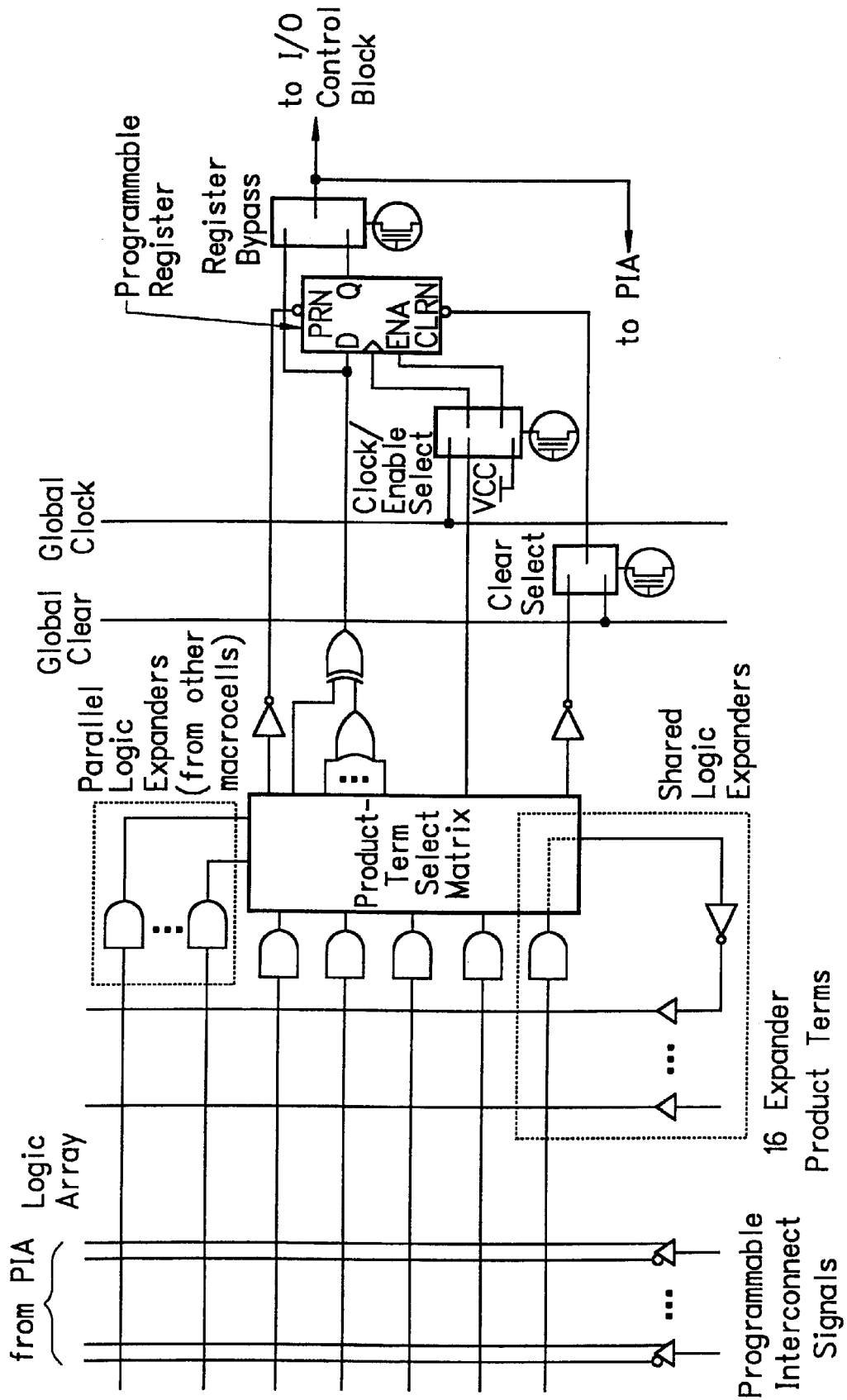
FIG. 3E is a diagram of a macrocell of the logic array block of FIG. 3D.

The macrocell of FIG. 3E is comprised of product terms, a product-term select matrix, expander product terms, parallel logic expanders. Further, a programmable register is provided. Clock, enable, and clear inputs of the programmable register may be programmably coupled to inputs determined by programmable multiplexers, controlled by way of programmable bits. Also, combinatorial or registered output from the macrocell may be programmably selected. A further discussion of the details of this macrocell may be found in the references previously referred to.

Figure 3F:
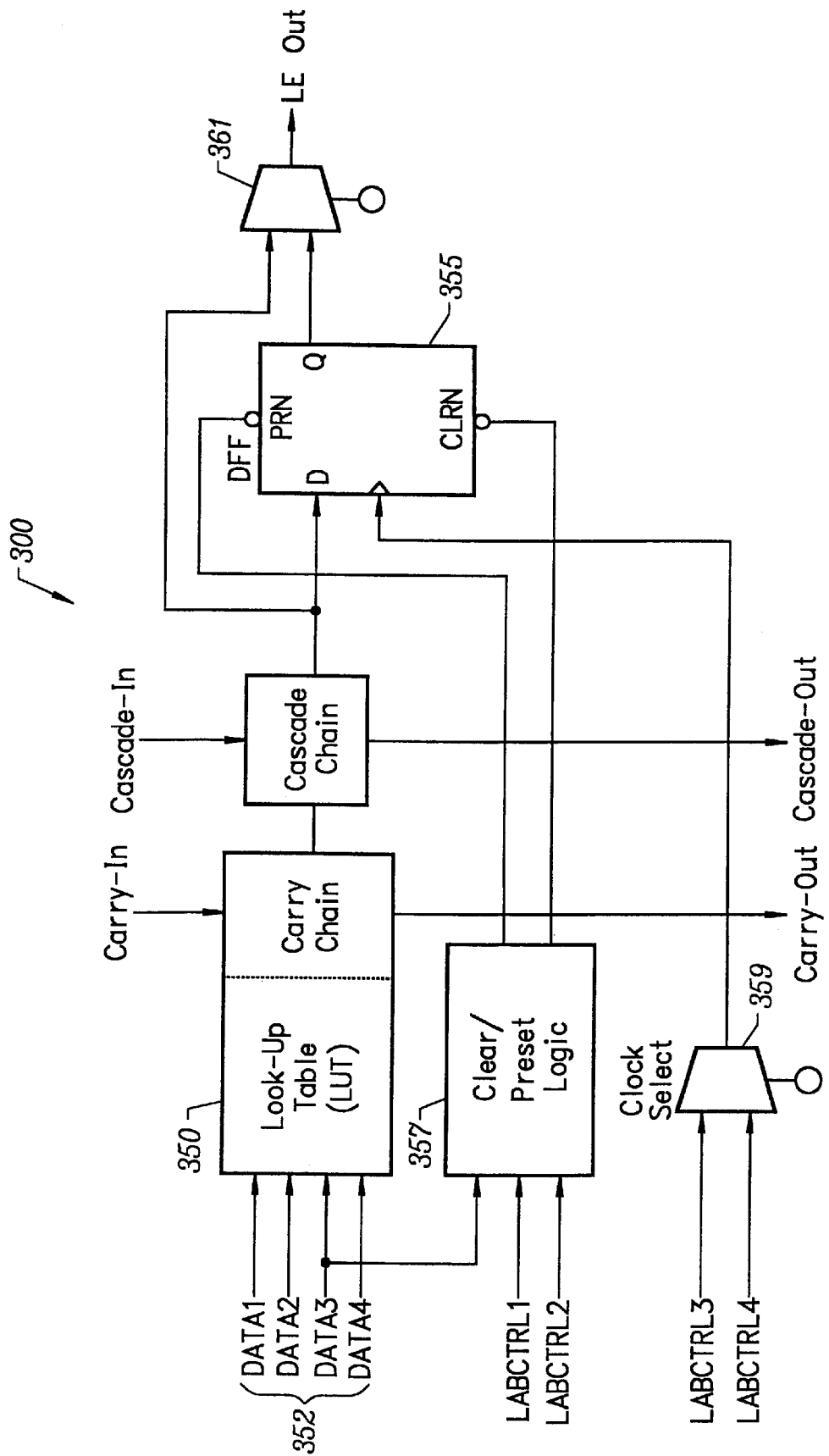
FIG. 3F is a embodiment of a logic element of the logic array block of FIG. 3A.

FIG. 3F shows a logic element (LE) 300 for a LAB 201, such as shown in FIG. 3A. LE 300 includes a look-up table (LUT) 350 which may be programmably configured to implement a function of four variables 452. LUT 350 may be implemented using memories, RAMs, multiplexers, programmable interconnect, AND-OR arrays, combinatorial logic, product terms, and combinations of these, as well as many other techniques.

A carry chain propagates carry signals between LEs 300. A cascade chain also links data between the LEs. Using carry chains and cascade chains, logical functions involving multiple LEs such as counters and registers may be implemented. An output of LUT 350 feeds into a programmable register 355 which provides registered functionality. A clear/preset logic block 357 programmably controls a clear and a preset input of register 355. A clock input to register 355 is programmably selected by a programmable multiplexer 359, controlled by way of a programmable bit. Combinatorial output from LUT 350 or registered output from register 355 may be programmably selected as output for LE 300 using a programmable multiplexer 361, also controlled by way of a programmable bit. From programmable multiplexer 361, the output of LE 300 may be programmably coupled to PIA 203, fed back to LEs 300 in LAB 201, and provide other routing of signals. A further discussion of the details of this LE may be found in the previously cited references.

Returning to FIG. 2, a global clock signal 217 connects to LABs 201 to allow synchronous and sequential logic operations such as latches, registers, and counters. External, off-chip circuitry may be used to drive the global clock signal 217. Furthermore, a global clear signal 223 connects to LABs 201 to clear latches and registers within LABs 201. External, off-chip circuitry may be used to drive the global clear signal 223.

LABs 201 may output to PIA 203 through connections 213. Connections 213 form a feedback loop from the LAB outputs back into PIA 203 to allow signals one LAB 201 to be passed to the same LAB or other LABs 201. This feedback loop uses PIA 203 resources.

LABs 201 may also output via connections 215 to input-output block 205. Input-output blocks 205 contain circuitry facilitating the connection of outputs 215 from LABs 201 to input-output pads 209 of the PLD. Through input-output blocks 205 and input-output pads 209, output signals from LABs 201 may be interfaced to external, off-chip circuitry. Furthermore, other internal PLD signals may be connected to external, off-chip circuitry by passing them through a LAB 201. Input-output blocks 205 also feedback outputs 215 of LABs 201 to PIA 203 through connections 220. This allows the output 215 of one LAB 201 to be coupled, via PIA 203, to itself or another LAB 201 in the PLD. Multiple LABs 201 may also be combined in this fashion.

In the embodiment shown in FIG. 2, input-output blocks 205 also have an output enable function, where the outputs at input-output pads 209 are enabled or disabled (or tristate). Output enable signals 219 and 221 are global signals, coupled to input-output block 205, for controlling whether specific outputs are enabled or disabled. Input-output blocks 205 are programmable to determine which input-outputs pads 209 are controlled (enabled or disabled) by which particular output enable signal, 219 or 221.

Furthermore, input-output blocks 205 are also programmably selectable to facilitate the passage of external, off-chip signals to circuitry internal to PLD 121. In this configuration, input-output blocks 205 act as input buffers, taking signals from input-output pads 209 and passing them to PIA 203 through connections 220. From PIA 203, these input signals can be programmably connected to LABs 201. In typical use, a portion of input-output pads 209 will be configured for use for input purposes and a portion will be configured for output purposes.

Figure 3G:
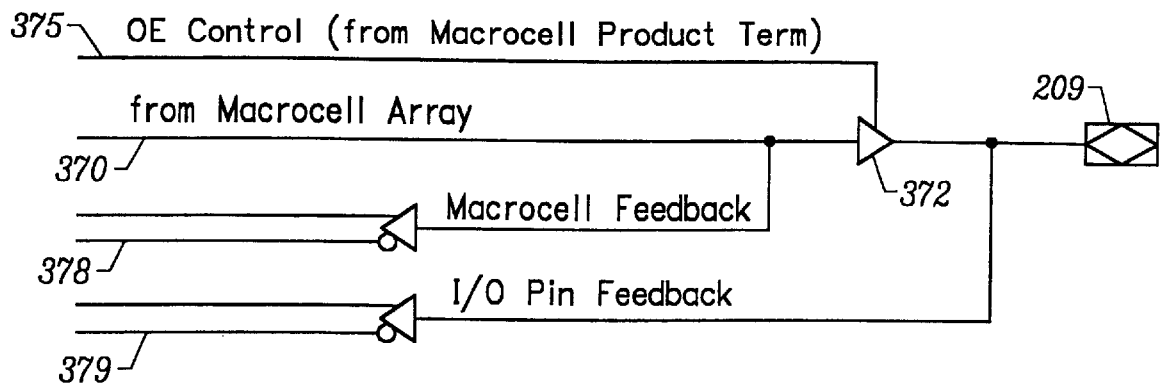
FIG. 3G is a diagram of an I/O control block.

FIG. 3G shows a specific embodiment of circuitry within input-output block 205. This is a I/O control block, which may be used with a macrocell or LE 300 of the PLD. For example, an output 370 from a macrocell (or LE 300) is programmably coupled through a tristate buffer 372 to a pad 209. Tristate buffer 372 is controlled using an OE control line 375, which may come from a dedicated OE signal, a macrocell product term, PIA 203, and many other sources. OE control line 375 determines whether tristate buffer 372 is enabled or disabled (i.e., tristated). Output 370 may be fed back to LAB 201, PIA 203, and other PLD resources via lines 378, and may also be fed back via lines 379. Tristate buffer 372 may be tristated, and lines 379 may be used to input data from pad 209 into the PLD.

Figure 3H:
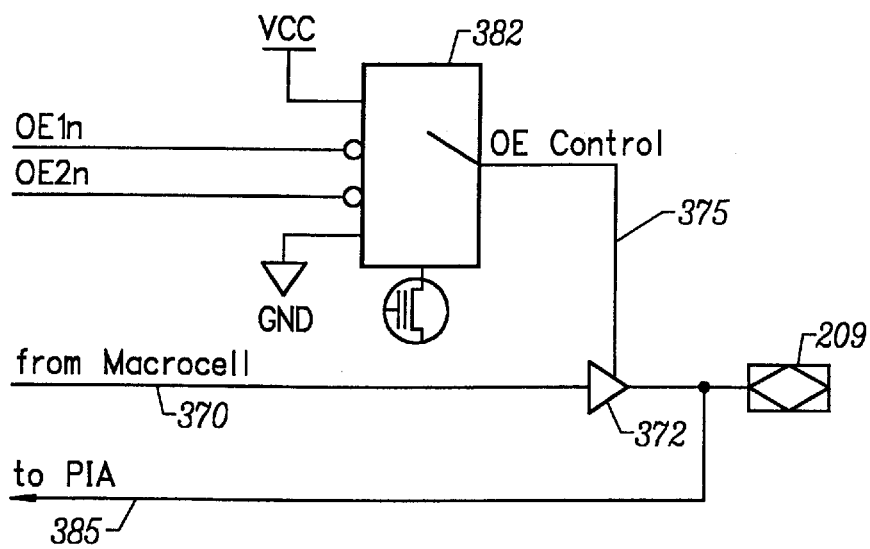
FIG. 3H is an embodiment of an I/O control block having a programmable multiplexer for controlling an output enable control line.

FIG. 3H is a further specific embodiment of circuitry within input-output block 205. This circuitry is somewhat similar to that in FIG. 3G. An output 370 from a macrocell (or LE 300) is programmably coupled through a tristate buffer 372 to a pad 209. Tristate buffer 372 is controlled using an OE control line 375, which may be coupled to a variety of sources using a programmable multiplexer 382 (controlled by way of a programmable bit). Tristate buffer 375 may be continuously enabled by programmably coupling OE control line 375 to VCC. Tristate buffer 375 may be continuously disabled by programmably coupling OE control line 375 to VSS. Tristate buffer 375 may also be controlled by OE1n or OE2n inputs.

When tristate buffer 372 is enabled, output 370 may be fed back to LAB 201, PIA 203, and other PLD resources via line 385. Tristate buffer 372 may be tristated, and line 385 may be used to input data from pad 209 into the PLD.

Returning to FIG. 2, memory block 250 includes RAM/FIFO block 252. RAM/FIFO 252 is a memory and associated logic for storing and retrieving data. Furthermore, RAM/FIFO 252 is programmably configurable to operate as a random access memory (RAM) in a RAM mode and first-in, first out (FIFO) memory in a FIFO mode. In particular, data are stored in RAM/FIFO 252 in either a directly addressable RAM organization or FIFO memory organization. In RAM mode, data are stored and retrieved by directly addressing specific locations in the memory. In the alternative, in FIFO mode, data are stored in and retrieved from the RAM in a first-in, first-out fashion. More specifically, data are retrieved from a FIFO memory in exactly the same order data were stored, like a queue—the first item in is also the first item out. Therefore, PLD 121 is programmably configurable to include a RAM or FIFO memory and can perform logical functions using these types of memories. A more detailed description of RAM/FIFO 252 is given below in the discussion of FIG. 5.

RAM/FIFO 252 may be dual-port memory. In this embodiment, data may be accessed using separate read and write address ports. In certain instances, data may be read and written into the memory simultaneously by components within the PLD and the external world. RAM/FIFO 252 may also be implemented as a single-port memory.

In other embodiments of the present invention, memory block may be a memory, RAM, FIFO, LIFO, LUT, or other memory or specialty memory, and combinations of these. For example, in a specific embodiment of the present invention, the programmable integrated circuit includes a single-port main memory. In another embodiment, the programmable integrated circuit includes a dual-port memory. Moreover, the programmable integrated circuit of the present invention may include a dedicated FIFO block. Still further, the programmable integrated circuit may include a memory block configured with a portion of directly addressable memory and a portion of FIFO memory. These are a few examples of the many variations of the present invention.

Referring to the embodiment shown in FIG. 2, data is input into RAM/FIFO 252 through a multiplexer 255 and a data input 263. Multiplexer 255 programmably selects from a data input source for RAM/FIFO 252. Programmable selection of multiplexer 255 is controlled by way of user-programmable memory bits (not shown) such as EEPROM cells. Depending on the state of such user-programmed bits, an appropriate data input source to RAM/FIFO 252 is selected. Multiplexer 255 has three sources of input, PIA 203, dedicated input pins 269, and output data from RAM/FIFO 252. Depending on the state of the user-programmed bits, one of these inputs is transferred through multiplexer 255 via bus 263 to RAM/FIFO 252. PIA 203 may be programmably coupled through a bus 257 to RAM/FIFO 252. Through this data path, LABs 201 and signals programmably connectable to PIA 203 may store data into RAM/FIFO 252. Through multiplexer 255 and dedicated inputs 269, external off-chip circuitry may also load RAM/FIFO 252 with data. Furthermore, a data output 261 of RAM/FIFO 252 may also be programmably selected as the data input for RAM/FIFO 252. This path is for feeding back data.

RAM/FIFO 252 also has a data output 262 which is connected to PIA 203. Through PIA 203, data stored in RAM/FIFO 252 may be used by other components within PLD 121, including LABs 201. For example, a sequential state machine can be designed using LABs 201 and RAM/FIFO 252. Based on its inputs, LABs 201 determine the current state of the state machine and provide RAM/FIFO 252 with the proper memory address for this state. Based on this address, RAM/FIFO 252 provides the Boolean outputs for this particular state, as well as pointers to the next possible states in the state machine. LABs 201 use these pointers, accessible via RAM/FIFO data output 262, and determines the next state for the state machine.

Data output from RAM/FIFO 252 is also programmably connectable to external, off-chip circuitry via output 261. Off-chip circuitry can use this RAM/FIFO 252 output data for performing off-chip logical functions. Furthermore, in one embodiment, output 261 may be tristateable, based on global output enable signals 219 and 221 (described below). When enabled, output data is produced at output 261. When disabled, output data is not produced at output 261; instead, output 261 will be in a high-impedance state. This feature allows output 261 to be connected to a bidirectional bus, such as a microprocessor's input and output lines.

RAM/FIFO 252 also has a memory address input 265. A multiplexer 253 programmably selects a memory address from either PIA 203 (via a bus 272) or dedicated inputs 269 to transfer to memory address input 265. Memory address input 265 may provide read or write addresses, or both, for RAM/FIFO 252. For example, data at data input 263 may be stored at the memory location indicated by a write address at memory address input 265. Programmable selection of multiplexer 253 is controlled by way of user-programmable memory bits (not shown) such as EEPROM cells. PIA 203 is connected through bus 272 and multiplexer 253 to RAM/FIFO 252. Through this connection to PIA 203, signals programmably connectable to PIA 203 may provide memory addresses for RAM/FIFO 252. For example, LABs 201 may be coupled through PIA 203 and multiplexer 253 to RAM/FIFO 252. Through this data path, LABs 201 may generate memory addresses for RAM/FIFO 252. Alternatively, through dedicated inputs 269, multiplexer 253 allows external off-chip circuitry to provide memory addresses for RAM/FIFO 252.

In FIG. 2, PIA 203 connects to a control signal input 259 of RAM/FIFO 252. In other embodiments of the present invention, control signal input 259 may be directly connected to a LAB 201 or an LE 300 without needing to pass through PIA 203. Further discussion of the various types of connections for control signal input 259 of the present invention accompanies the discussion of FIGS. 4A–4D.

Control signal input 259 governs the reading, writing, clocking, clearing, resetting, enabling, output enable, and other similar operations of RAM/FIFO 252. Control signal input 259 may contain a plurality of control signals. In one embodiment, control signal input 259 includes five control signals, described further below. Through PIA 203, LABs 201 are programmable connectable to control signal input 259 to direct RAM/FIFO 252 operations. For example, one LAB 201 may be configured to enable writing of data into RAM/FIFO 252 upon the occurrence of certain logic conditions. A more detailed description of control signal input 259 accompanies the discussion of FIG. 5 below.

RAM/FIFO 252 generates a flag signal output 276, which is connected to PIA 203. Flag signal output 276 may include a plurality of flag signals, where each flag signal indicates a different condition. RAM/FIFO 252 uses flag signal output 276 to provide status information of RAM/FIFO 252 for other components within PLD 121. For example, a "full" flag signal may indicate whether RAM/FIFO 252 is full, which means that no memory locations are available for storing data. The full flag signal may be TRUE or FALSE. The full flag signal may be connected through PIA 203 to a LAB 201, which will disable writing of data into RAM/FIFO 252 when RAM/FIFO 252 is full. In one embodiment, there are four flag signals. A more detailed description of these flag signals accompanies the discussion of FIG. 5 below.

Three clock inputs, global clock signal 217, a MEMCLK0 signal 275, and a MEMCLK1 signal 277, may be programmably selected for controlling the clocking of data into RAM/FIFO 252. Global clock signal 217 is a global signal which is programmably connected to LABs 201 as well as RAM/FIFO 252. For example, global clock signal 217 may be used to synchronize particular LABs 201 and RAM/FIFO 252 operations. External, off-chip circuitry may also be programmably selected to control the clocking of RAM/FIFO 252 through dedicated clock inputs MEMCLK0 275 and MEMCLK1 277.

Furthermore, RAM/FIFO 252 may be operated in an asynchronous mode or a synchronous mode, which is in a preferred embodiment, programmably selectable. For synchronous operation, data will be clocked into and out of RAM/FIFO 252 in response to a clock signal (e.g., global clock signal 217). During asynchronous operation, data is input and output from RAM/FIFO 252 in response to a strobe input and enable read and enable write signals.

Two global output enable signals, 219 and 221, are coupled to RAM/FIFO 252 and control whether output 261 is tristated or enabled. As discussed previously, global output enable signals 219 and 221 are also coupled to input-output blocks 205 for controlling the output enable feature of these blocks.

The programmable integrated circuit of the present invention is useful in many applications such as communications, networks, digital video, digital telephony, multimedia, and many others, where the FIFO performs as a specialty high-speed buffer. Furthermore, in a preferred embodiment, the programmable integrated circuit is controlled by way of programmable cells, such as EEPROM or Flash cells, which may be programmably configured using in-system programming (ISP).

ISP programming is a technique where the programmable resources of a programmable integrated circuit are configured (programmed or erased) while resident in the system. Specifically, the programmable integrated circuit need not be removed from the circuit board and configured using an apparatus specially designed for programming such integrated circuits (e.g., Data I/O programmer). ISP programming allows greater flexibility when reprogramming programmable circuits. For example, the configuration information in a programmable circuit may be updated or modified as needed, and as many times as needed (even "on-the-fly" during system operation), without requiring the removal and installation of components, or disassembly of the system. The configuration will also be nonvolatile, which means that the stored information is retained even when power is removed.

FIGS. 4A–4D are block diagrams of various types of connections or connection paths between LE 300 and RAM/FIFO 252 and PIA 203 and RAM/FIFO 252. In the embodiment shown in FIG. 4A, an LE 300 of a LAB 201 is programmably connectable to the control (259), data (263), or address (265) inputs of RAM/FIFO 252. There are one or more programmable direct connections 405 to control (259), data (263), and address (265) lines of RAM/FIFO 252. One advantage of this connection path is that directly connecting LE 300 to RAM/FIFO 252 bypasses PIA 203, thus avoiding PIA-associated delays.

The control, data, and address inputs to RAM/FIFO 252 include those described above, and will be described in more detail below. Furthermore, control inputs may include, for example, inputs for write enable, read enable, clock, strobe, output enable. Data inputs of RAM/FIFO 252 may be used to input data into the memory block of the PLD. These may be coupled to data input 263. For example, data from a LAB 201 may be coupled to and stored in RAM/FIFO 252. Address inputs of RAM/FIFO 252 are used for controlling or selecting the addresses of FIFO 252. For example, by controlling the addressing of RAM/FIFO 252, a LAB 201 may specifically customize the operation of RAM/FIFO 252 to a particular application.

In the embodiment shown in FIG. 4B, signals from PIA 203 of PLD 121 are programmably connectable to the control (259), data (263), or address (265) inputs of RAM/FIFO 252. There are one or more programmable connection paths 410 from PIA 203 to control (259), data (263), or address (265) lines of RAM/FIFO 252. PIA 203 has vertical conductors 240 and horizontal conductors 244. Vertical and horizontal conductors are programmably connectable at intersections 242 of these two conductors. Furthermore, connections 410 are from a fully populated multiplexing scheme, which means that every signal (vertical conductor) in PIA 203 is connectable to horizontal conductor 244 to control inputs to RAM/FIFO 252. For example, a LAB 201 may be programmably connected through PIA 203 to control (259), data (263), and address (265) inputs to RAM/FIFO 252. Specifically, an output 213 of LAB 201 is programmably coupled to a vertical conductor 240 of PIA 203. This vertical conductor 240 is programmably coupled at intersection 242 to a horizontal conductor 244 to control (259), data (263), and address (265) lines of RAM/FIFO 252.

The embodiment shown in FIG. 4C is similar to that shown in FIG. 4B. A difference is that a partially populated multiplexer 420 is used for connecting vertical conductors 240 of PIA 203 to horizontal conductors 242. Partially populated multiplexing only allows selected vertical conductors 240 in PIA 203 to be programmably coupled to RAM/FIFO 252. For example, in one embodiment, only a selection three of the vertical conductors 240 may be programmably coupled to connections 405. Partially populated multiplexing requires fewer programmable connections than fully populated multiplexing. Therefore, partially populated multiplexing results in reduced integrated circuit die sizes. Further, performance may improve due to the reduced parasitics on the interconnect lines.

In FIG. 4D, a partially populated multiplexer 430 programmably connects vertical conductors 240 of PIA 203 to a full crossbar switch 450. Crossbar switch 450 is a switch that programmably connects one of its inputs, horizontal conductors 244, to one of its outputs, which couples to the control (259), data (263), and address (265) lines of RAM/FIFO 252. Crossbar switch gives greater flexibility in permitting a horizontal conductor 244 to programmably connect to many different RAM/FIFO 252 inputs. This scheme may also be used with fully populated multiplexing.

Figure 5:
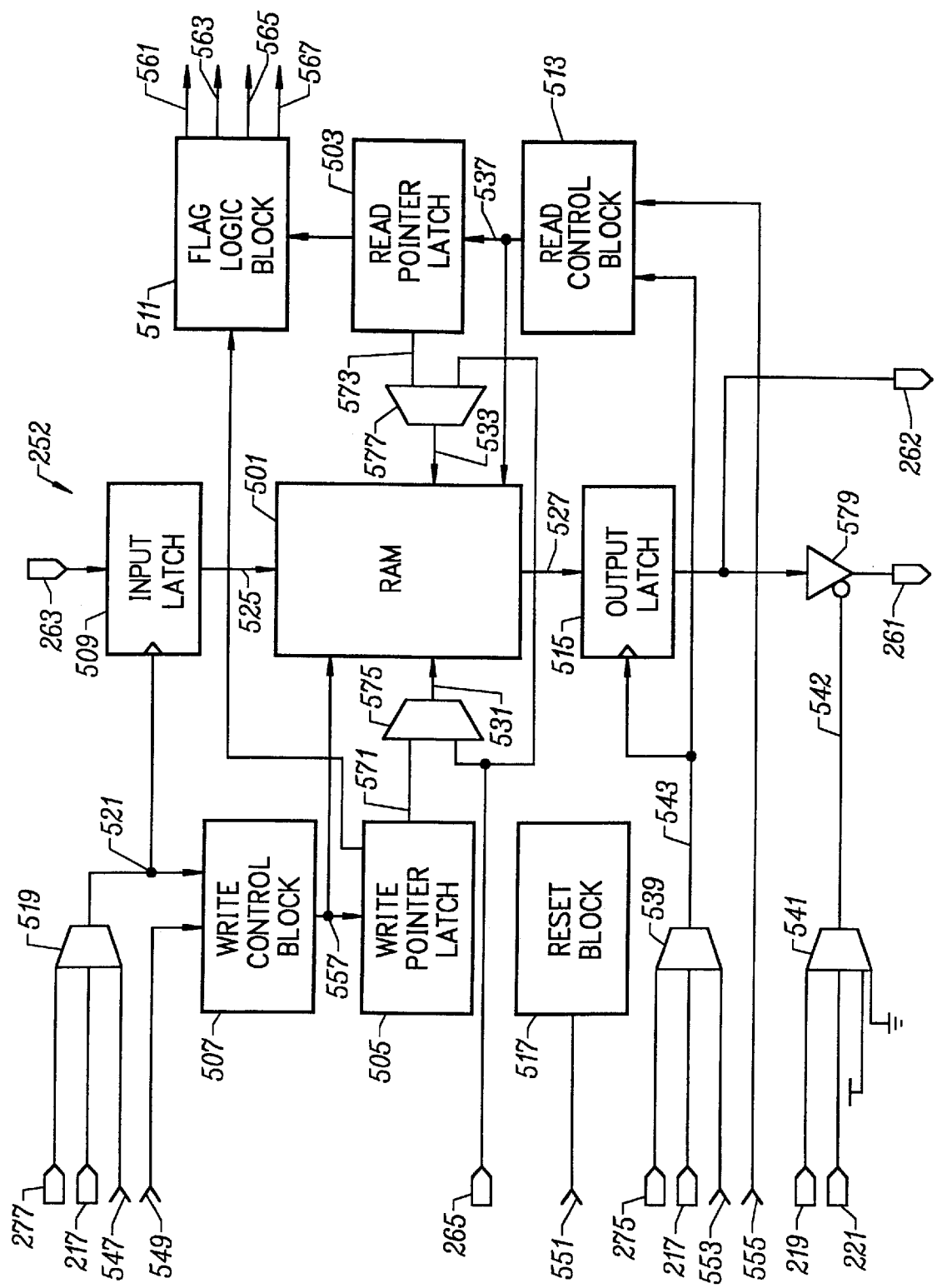
FIG. 5 is a more detailed block diagram of the memory block of the programmable logic device integrated circuit of FIG. 2.

FIG. 5 is a more detailed block diagram of RAM/FIFO 252 of FIG. 2. RAM/FIFO 252 includes a RAM 501, which is a random access memory for storing data. In other embodiments, RAM 501 may be contained in separate components. Many technologies can be used for the RAM cells including, among others, dynamic-, static-, and nonvolatile-type memory cells such as DRAM, SRAM, EPROM, and EEPROM. In a specific embodiment, RAM 501 is organized as an array of SRAM cells arranged 1024-words deep by 10-bits wide.

As discussed above, RAM/FIFO 252 can be configured to operate as a RAM or a FIFO. This configuration may be stored using, for example, EEPROM or Flash EEPROM cells. In the RAM mode, data are stored in or retrieved from RAM 501 by direct addressing. In FIFO mode, data are stored in and retrieved from RAM 501 in a first-in, first-out manner. For example, the mode of operation may be changed from RAM mode to FIFO mode, and vice versa simply by reconfiguring the EEPROM configuration cells. Therefore, the RAM/FIFO 252 operation may be changed "on-the-fly" using ISP programming.

Multiplexers 575 and 577 programmably select whether RAM/FIFO 252 is operating in RAM or FIFO mode. Programmable selection of multiplexers 575 and 577 are controlled by way of user-programmable memory bits (not shown) such as EEPROM cells. Multiplexer 575 selectively couples either address bus 265 (also shown in FIG. 2) or an output 571 of a write pointer latch 505 to a write address bus 531 of RAM 501. Multiplexer 577 selectively couples either address bus 265 or an output 573 of a read pointer latch 503 to a read address bus 533 of RAM 501. Write address bus 531 selects an address where input data 525 is written into RAM 501. Read address bus 533 selects an address where data is output from RAM 501.

RAM operation is enabled when multiplexer 575 couples address bus 265 to write address bus 531 and multiplexer 577 couples address bus 265 to read address bus 533. In RAM mode, direct memory addressing, via address bus 265, is used to determine the memory location where data are stored and retrieved. For example, an address is provided onto both write address bus 531 and read address bus 533 of RAM 501. Data may be read and written to the address location provided to RAM 501.

FIFO operation is enabled when multiplexer 575 selectively couples write pointer latch 505 to write address bus 531 and multiplexer 577 selectively couples read pointer latch 503 to read address bus 533. In FIFO mode, addresses for reading (or retrieving) data are provided by read pointer latch 503 and addresses for writing (or storing) data are provided by write pointer latch 505. Read pointer latches 503 and write pointer latch 505 are latches, or registers in other embodiments, for holding the memory addresses for the reading and writing of data. Read pointer latch 503 and write pointer latch 505 are updated with new addresses after store or retrieve operations.

A write control block 507 is coupled to write pointer latch 505 and a read control block 513 is coupled to read pointer latch 503. Write control block 507 controls the operation of write pointer latch 505 via control line 557. Read control block 513 controls the operation of read pointer latch 503 via a control line 537. In operation, write and read control logic blocks 507 and 513 implement a FIFO memory organization by determining and updating the addresses in read pointer latch 503 and write pointer latch 507 each time data is stored or retrieved. For example, read pointer latch 503 points to a particular address location in RAM 501. After an item is retrieved from RAM 501, this item is no longer supposed to be in the FIFO. To account for this, in response to control signal 537, read pointer latch 503 is incremented (or decremented in other embodiments) to the next address location holding valid data. Similarly, after a write operation, responsive to signal 557, write pointer latch 507 is similarly incremented, decremented, or adjusted to the next open address location in RAM 501. Furthermore, signals 537 and 557 are coupled to RAM 501 and are used as a write strobe for RAM 501.

Data are stored into RAM 501 using input bus 263 of FIG. 2. From input bus 263, data are first stored into an input latch 509, which is coupled to input bus 525 of RAM 501. Then, input latch 509 is clocked and data may be written into RAM 501. Input latch 509 may be programmed to operate in one of five clocking modes: leading-edge-triggered register, trailing-edge-triggered register, active-high latch, active-low latch, or as a direct combinatorial bypass. This feature allows more flexibility in how data is input into RAM 501.

In leading-edge-triggered register mode, input latch 509 will function as a register, which will be responsive to a leading edge of a clock input. In trailing-edge-triggered register mode, input latch 509 will function as a register, which will be responsive to a falling edge of a clock input. In active-high latch mode, latch 509 will function as a latch, latching data which its clock input is a high. In active-low latch mode, latch 509 will function as a latch, latching data when its clock input is a low. In direct combinatorial bypass mode, latch 509 will pass data through without any clocking; in this mode, latch 509 becomes transparent.

In both FIFO and RAM modes, data is clocked out of RAM 501 through an output latch 515, which is coupled to an output bus 527 of RAM 501. Output latch 515 is also programmable to operate in one of the five clocking modes described above for input latch 509. Output latch 515 outputs data to output bus 262, which is coupled to PIA 203, as shown in FIG. 2. Furthermore, output latch 515 is also coupled to output bus 261 through a tristate buffer 579. When tristate buffer 579 is enabled, output data from latch 515 can be transferred onto output bus 261. In the alternative, when tristate buffer 579 is disabled, output bus 261 will be in a high-impedance state (i.e., tristate).

A multiplexer 541 programmably selects an output enable control signal 542 coupled to tristate buffer 579. Programmable selection of multiplexer 541 is controlled by way of user-programmable memory bits such as EEPROM cells. Multiplexer 541 can continuously enable or disable output 261 by connecting output enable input 542 of tristate buffer 579 to ground or VCC, respectively. Furthermore, output enable 542 can be driven by global output enable signals 219 or 221.

A multiplexer 519 programmably selects a clock signal 521 for input latch 509 and write logic 507. Programmable selection of multiplexer 519 is controlled by way of user-programmable memory bits such as EEPROM cells. Multiplexer 519 can programmably select MEMCLK1 277, global clock 217, or a signal 547 from PIA 203 as clock signal 521. MEMCLK1 277 and global clock 217 were described earlier. As for signal 547, a signal programmably connectable to PIA 203 may used to generate signal 547. For example, via PIA 203, a LAB 201 may be used to generate signal 547.

A multiplexer 539 programmably selects a clock signal 543 for output latch 515 and read control logic 513. Programmable selection of multiplexer 539 is controlled by way of user-programmable memory bits such as EEPROM cells. Multiplexer 519 can programmably select MEMCLK0 275, global clock 217, or a signal 553 from PIA 203. MEMCLK0 275 and global clock 217 were described earlier. As for signal 553, any signal programmably connectable to PIA 203 may be used. For example, via PIA 203, a LAB 201 may provide a signal 553 to control clocking of output latch 515 and read control block 513.

Clocking signals 521 and 543 are used to clock data into input latch 509 and output latch 515, respectively. Clock signals 512 are also used to synchronize write control logic 507 and read control logic 513 to the clocking input latch 509 and output latch 515, respectively.

Furthermore, five control inputs control the operation of RAM/FIFO 252. These five control inputs are enable write (ENW) 549, enable read (ENR) 555, clear (CLR) 551, write clock (CKW) 521, and read clock (CKR) 543. CKW 521 and CKR 543 are the clock signals generated by multiplexer 519 and multiplexer 539, respectively, which were described above.

ENW 549 is coupled to write control logic 507 and comes from PIA 203 (shown as control signal 259 in FIG. 2). A signal programmably connectable to PIA 203 may generate ENW 549. For example, a LAB 201 may generate ENW 549. ENW 549 enables the writing of data into RAM 501. Moreover, ENW 549 causes write control logic 507 to update write pointer latch 505 to the next memory location to be written in RAM 501 at the proper clock cycle of clock signal 521.

ENR 555 is coupled to read control logic 513 and comes from PIA 203 (shown as control signal 259 in FIG. 2). A signal programmably connectable to PIA 203 may generate ENR 555. For example, a LAB 201 may generate ENR 555. ENR 555 enables the reading of data from RAM 501. Moreover, ENR 555 causes read control logic 513 to update read pointer latch 503 to the next memory location to be read at the proper cycle of clocking signal 543.

CLR 551 is coupled to a reset logic block 517 and comes from PIA 203 (shown as control signal 259 in FIG. 2). Any signal programmably connectable to PIA 203 may generate CLR 551. For example, a LAB 201 may generate CLR 551. Reset logic 517 is coupled (not shown) to write pointer latch 505, write control logic 507, read pointer latch 503, and read control logic 513. Responsive to CLR 551, reset logic 517 resets and clears the FIFO control blocks and pointers. In one embodiment, upon powering up of the PLD integrated circuit, reset logic 517 provides a power-on reset of FIFO control blocks and pointers.

RAM/FIFO 252 has a flag logic block 511 which produces flags that provide status information for the PLD. Flags have two states, true or false. A flag is true when the status condition they represent occurs, otherwise a flag will be false. In one embodiment, flag logic block 511 generates flag signals to indicate the status of the FIFO during FIFO mode. As shown in FIG. 5, flag logic block 511 takes inputs from read pointer latch 503 and write pointer latch 523 to determine the status of the FIFO. There can be any number of flags. In the embodiment of FIG. 5, there are four flags, a full flag 561, almost full flag 563, almost empty flag 565, and empty flag 567.

Full flag 561 is true when the FIFO is full, which occurs when RAM 501 has no empty memory locations available for storing data. For example, an indication of a full FIFO may occur when write pointer latch 505 points to a memory address in the RAM which is a last available address location in RAM 501. Another technique to determine whether the FIFO is full is when a difference between the addresses in the write address pointer and read address pointer is equal to or exceeds the maximum number of locations in the FIFO. These are just a few of the techniques, among many others, to determine whether the FIFO is full. The logic of a PLD may use full flag 561 for a multitude of purposes: For example, when full flag 561 is true, the PLD may begin to flush the FIFO of its data.

Almost full flag 563 is true when RAM 501 has only a specified number of empty memory locations remaining available for data storage. This specified number may be user-selected by programming memory cells with this number. For example, a user may select four as the specified number empty memory locations. The user programs this number, which may be represented in binary, into the PLD. The specified number may be stored in, for example, nonvolatile EEPROM or Flash EEPROM cells coupled to the write control logic. This specified number may also be reprogrammed as desired, possibly through in-system programming during the operation of the PLD. Almost full flag 563 is true when the specified number of empty memory locations is exceeded (e.g., four or fewer empty memory locations remain).

Almost full flag 563 is useful for a multitude of different applications. For example, almost full flag 563 may be used as an early indicator that the FIFO is becoming full. As a further example, a user may use the FIFO to store incoming data having a width greater than that for a single memory cell of the RAM. Then, the incoming data will be stored in memory locations, which may be consecutive. For example, if the incoming data is 20-bits wide, and the FIFO is 10-bits wide, then a byte of the incoming data may be stored in two memory locations in the RAM. Consequently, the full flag 561 may not accurately represent whether the FIFO is full. In this case, programmable almost full flag 563 could be programmed to more accurately reflect whether the FIFO is full.

Empty flag 567 is true when the FIFO is empty, which occurs when no data is stored in RAM 501. For example, an indication of an empty FIFO may occur when write pointer latch 505 points to a memory address in the RAM which is a first available address location in RAM 501. Another indication of an empty FIFO is when write address pointer 505 points to the same location as the read address pointer 503. These are just a few of the techniques, among many others, which may be used to determine whether the FIFO is empty.

Empty flag 567 may be used in to implement the logic of the programmable logic device. For example, when empty flag 567 is true, the PLD logic should not allow attempts to read any data from the FIFO.

Almost empty flag 565 is true when RAM 501 has only a specified number of memory locations already filled with data. Analogous to almost full flag 563, almost empty flag 565 is also user-programmable. For example, a user may select four as the specified number of occupied memory locations. The user programs this number in the PLD. Almost empty flag 565 is true when the specified number of occupied memory locations is exceeded (e.g., four or fewer occupied memory locations). Almost empty flag 565 may be used to create the desired logical functions for many different applications.

In a preferred embodiment, the flag signals of the present invention are routed to PIA 203 of FIG. 2 (shown as connection 276), so they may be connected to LABs 201 and LEs to drive the PLD's logic functions. Flag signals may be routed to any input-output pad 209 through PIA 203 and a LAB 201. In other embodiments, the flag signals are directly connectable to the pads.

Figure 6:
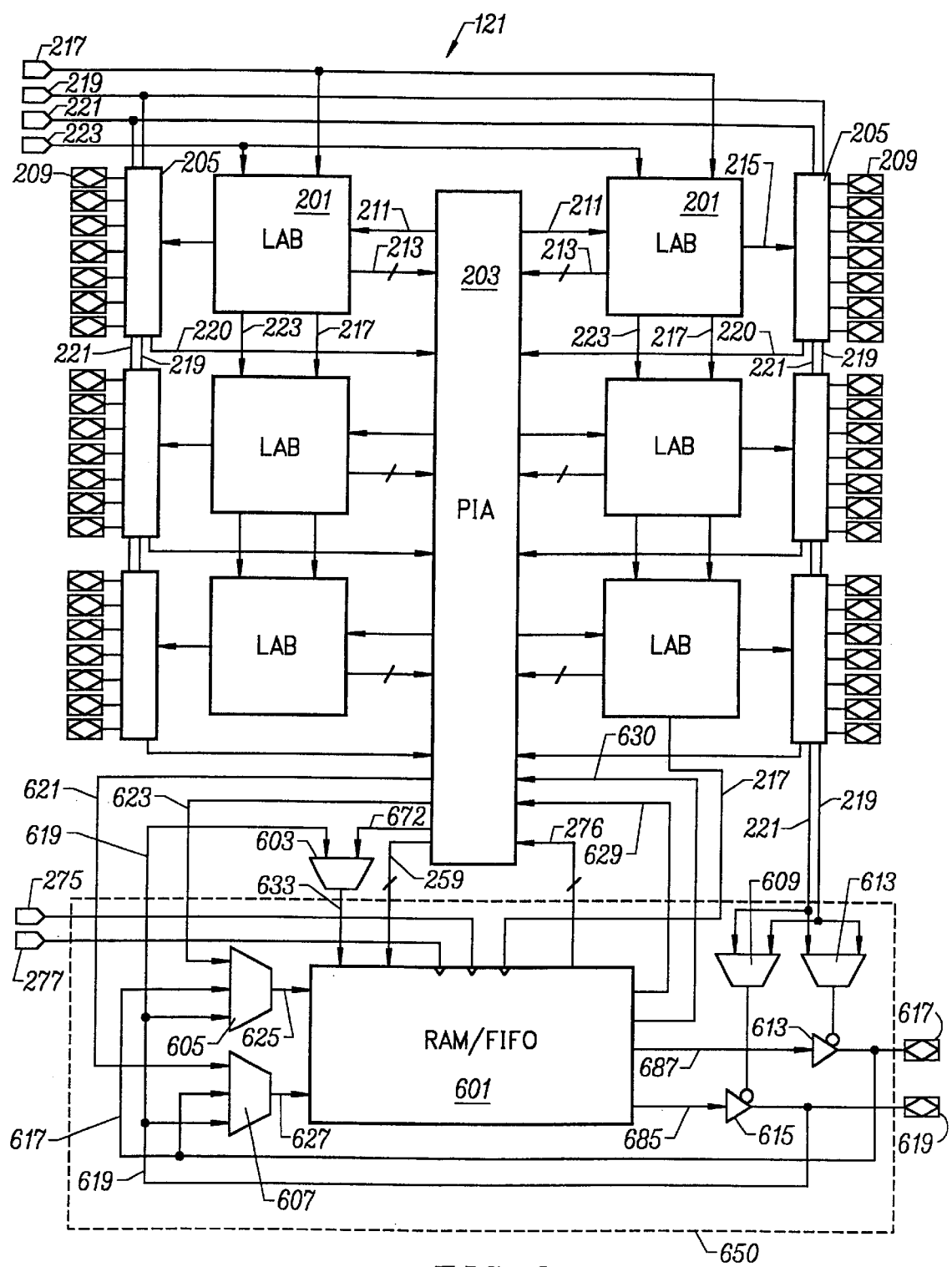
FIG. 6 is a block diagram of a further embodiment of the programmable logic device integrated circuit of the present invention, where the memory block has a programmably selectable word size and depth size.

FIG. 6 is a block diagram of a more elaborate embodiment of PLD 121 of FIG. 2. There are many similarities between FIG. 2 and FIG. 6. Like numbered references in FIG. 2 are similar to like numbered references in FIG. 2. The following will only discuss the differences between FIG. 6 and FIG. 2.

In FIG. 6, PLD 121 includes a memory block 650, which is configurable as either a RAM or FIFO memory, as in FIG. 2. However, memory block 650 may be organized, in various word-size and depth-size formats. The organization of memory block 650 is programmably selectable using user-programmable memory bits (not shown) such as EEPROM cells. In a specific embodiment, memory block 650 can be organized in either a 512-word by 20-bit format or a 1024-word by 10-bit format. More specifically, in this embodiment of the present invention, the organization of the memory is programmably configurable. The memory may be organized in any format.

Other examples include a memory configurable as 256×18 or 512×9, 256×16 or 512×8, and 1024×8 or 512×16, to name a few. Also, other variations are possible such as a 512×9 memory may be "split" into two smaller memories of 256×9. There are many other memory size organizations, for example, variable in any format between 256×18 and 512×9, and 256×16 and 512×8. For example, a 256×18 memory may be organized in any word width such as 1-bit wide, 2-bits wide, 3-bits wide, and so forth, where the memory depth also adjusts appropriately so that all 4608 (256×18) bits are used. The memory may also be organized as separate memories, for example two 256×9 blocks. This feature allows greater flexibility in the design of logical functions. Some designs require a longer word size, while others require a greater number of words. Some logical functions which would have required two PLDs can be performed in one PLD of FIG. 6. Therefore, more logical functions can be implemented using a single PLD.

Memory block 650 contains RAM/FIFO block 601, a memory where data are stored for RAM or FIFO operations. RAM/FIFO block 601 is similar to RAM/FIFO block 251 and will be described further below in the discussion of FIG. 7. Data inputs (625 and 627) and data outputs (685 and 687) to RAM/FIFO 601 are split in two halves, each half representing half of a maximum memory word size. For example, inputs 625 and 627 and outputs 685 and 687 contain ten bits each, the word size will be selectable between ten bits and twenty bits. In other embodiments of the present invention, bits in a memory word may be apportioned among different buses in any desired proportion. For example, one bus may be five bits wide and another may be fifteen bits wide. The maximum word size of the two buses would be twenty bits. Furthermore, the memory may have more than two portions.

Data is input to RAM/FIFO 601 comes from several sources, programmably selectable by multiplexers 605 and 607. These sources are PIA 203 via a bus 623, an input-output pad 617, and an input-output pad 619. In one embodiment, programmable selection of multiplexers 605 and 607 is controlled by memory cells such as EEPROM or flash bits. External, off-chip input data can be stored into RAM/FIFO 601 using input-output pads 617 and 619. Input-output pad 617 may input data to RAM/FIFO 601 through both multiplexers 605 and 607. And input-output pad 619 may input data to RAM/FIFO 601 through both multiplexers 605 and 607. In typical operation, one input-output pad (e.g., 617) may be used for input to RAM/FIFO 601 and the other (e.g., 619) may be used for output, or vice versa.

Furthermore, PIA 203 is connected through connections 621 and 623 and multiplexers 605 and 607, respectively, to RAM/FIFO 601. Using these connections to PIA 203, signals programmably connectable to PIA 203 may be input into RAM/FIFO 601. For example, LABs 201 may be coupled through PIA 203 to RAM/FIFO 601. Through this data path, LABs 201 may store data into RAM/FIFO 601.

RAM/FIFO 601 has several data output paths. Data output is coupled to PIA 203 through buses 629 and 630, each bus containing a portion of the maximum memory word size. Through this path, data stored in RAM/FIFO 252 may be used by other components programmably connectable to PIA 203 within PLD 121, including LABs 201.

Data may also be output through data outputs 685 and 687. Data output 685 outputs a portion of bits comprising the maximum word width and data output 687 outputs the remaining portion. Data output 685 of RAM/FIFO 601 is coupled to input-output pad 619 through tristate buffer 615. Tristate buffer 615 controls whether input-output pad 619 is enabled or disabled. When tristate buffer 615 is enabled, data output 685 is passed to input-output pad 619. When tristate buffer 615 is disabled, input-output pad 619 will be in a high-impedance state (tristate). Tristate buffer 615 is controlled by one of two global output enable signals 219 and 221. Multiplexer 609 programmably selects, controlled by an EEPROM cell, the output enable signal, 219 or 221, that controls tristate buffer 615. Through input-output pad 619, data from RAM/FIFO 601 is passed to external, off-chip circuitry.

Similarly, data output 687 of RAM/FIFO 601 is coupled to input-output pad 617 through tristate buffer 613. Tristate buffer 613 controls whether input-output pad 617 is enabled or disabled. When tristate buffer 613 is enabled, data output 687 is passed to input-output pad 617. When tristate buffer 613 is disabled, input-output pad 617 will be in a high-impedance state (tristate). Tristate buffer 613 is controlled by one of two global output enable signals 219 or 221. Multiplexer 611 programmably selects, controlled by an EEPROM cell, the output enable signal, 219 or 221, that controls tristate buffer 613. Through input-output pad 617, data from RAM/FIFO 601 is passed to external, off-chip circuitry.

Memory addresses for RAM/FIFO 601 are input via a memory address input bus 633. A multiplexer 603 programmably selects a memory address from either PIA 203 or input-output pad 619 (which is also connected to multiplexers 607 and 605). Programmable selection of multiplexer 603 is controlled by way of user-programmable memory bits (not shown) such as EEPROM cells. PIA 203 is connected through a connection 672 to multiplexer 603 to RAM/FIFO 601. Using this connection to PIA 203, signals programmably connectable to PIA 203 may provide memory addresses for RAM/FIFO 601. For example, LABs 201 may be coupled through PIA 203 and multiplexer 603 to RAM/FIFO 601. In particular, through this data path, LABs 201 may provide memory addresses for RAM/FIFO 252. Alternatively, via multiplexer 603 and input-output pad 619, external off-chip circuitry may provide memory addresses for RAM/FIFO 601.

Similar to the embodiment in FIG. 2, control signals from PIA 203 are programmably coupled to RAM/FIFO 601. These will be discussed in more detail below in connection with FIG. 7. Also, RAM/FIFO 601 generates flag signals 276, coupled to PIA 201, to indicate the status of RAM/FIFO 601. These will also be discussed in more detail below in connection with FIG. 7. Clocking for RAM/FIFO 601 is similar to clocking for RAM/FIFO 252 described above. There are three clock inputs to RAM/FIFO 601, a global clock 217, MEMCLK0 275, MEMCLK1 277.

Figure 7:
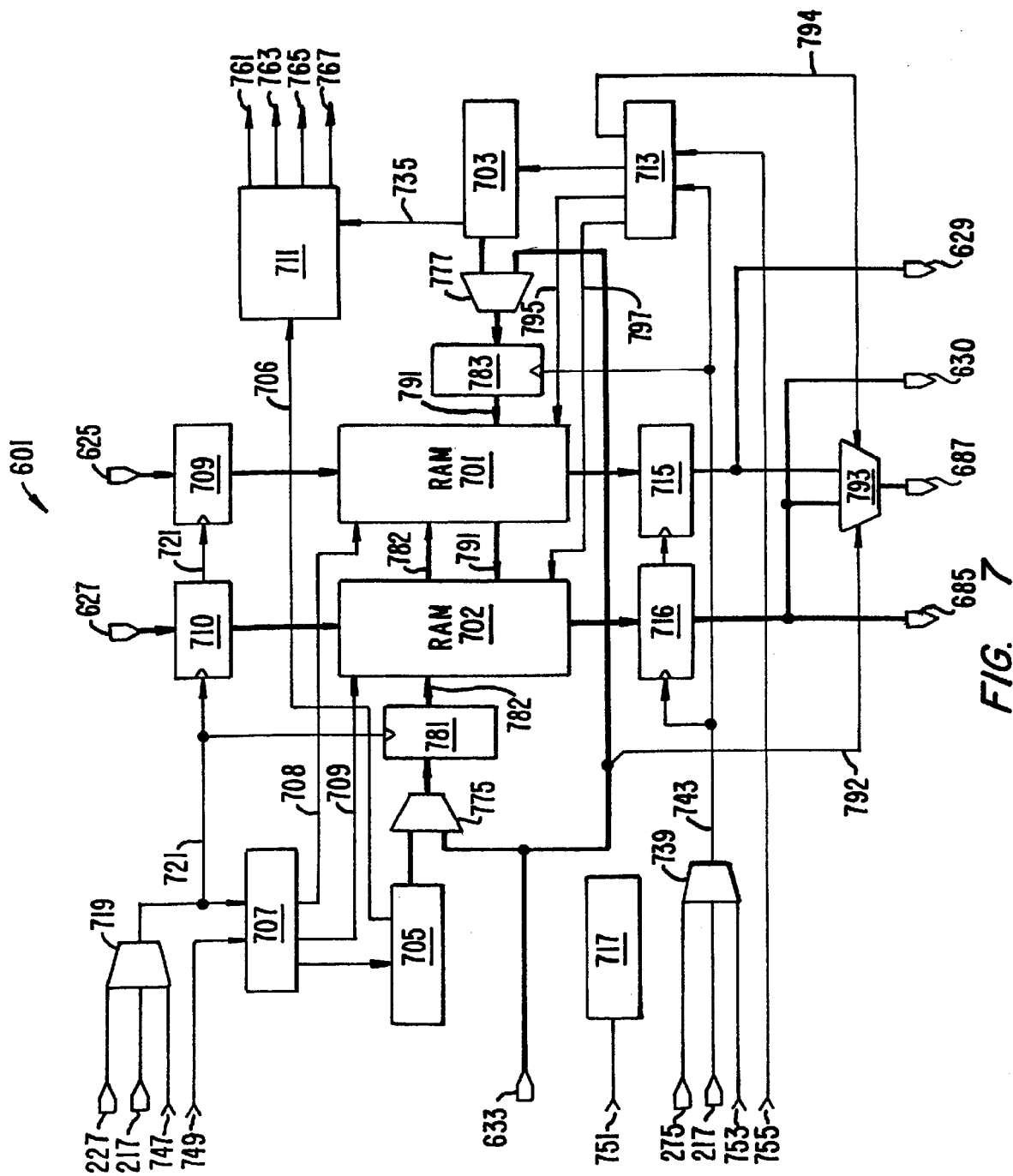
FIG. 7 is a more detailed block diagram of the memory block of FIG. 6.

FIG. 7 is a more detailed block diagram of RAM/FIFO block 601 of FIG. 6. The memory organization (e.g., word size and depth size) of RAM/FIFO 601 is programmably selectable. In an embodiment, RAM/FIFO 610 may be configured in either a 512-word by 20-bit format or 1024-word by 10-bit format. RAM/FIFO 601 shares many similarities to RAM/FIFO 252.

Data are stored in RAMs 701 and 702, which may be any size. In a specific embodiment, RAMs 701 and 702 are organized in a 512-words deep by 10-bits wide format. When configured as a RAM, data are stored or retrieved by direct addressing. When configured as a FIFO memory, data are stored in and retrieved from the RAM in a first-in, first-out manner. Many other memory organizations may be selected. For example, RAMs 701 and 702 may be 512×9, 512×8, 256×9, 256×8, 256×18, and 256×16, among others.

Programmable multiplexers 775 and 777 determine whether the RAM/FIFO block operates as a FIFO or a RAM. Programmable selection of multiplexers 775 and 777 is controlled by way of user-programmable memory bits (not shown) such as EEPROM cells. When multiplexers 775 and 777 are programmed to select input from address bus 633, RAM operation is enabled. If multiplexers 775 and 777 are programmed to select input from a write pointer latch 705 and a read pointer latch 703, respectively, FIFO operation is enabled. Read pointer latch 703 and write pointer latch 705 are similar to read pointer latch 503 and write pointer latch 505, respectively, described above. A memory address is input via address bus 633, through multiplexers 775 and 777, to address registers 781 and 791, respectively, and then clocked onto memory address buses 782 and 791, respectively, into both RAMs 701 and 702. In RAM mode, direct memory addressing is used to determine the memory location where data are stored and retrieved. Write address bus 782 is used for the write address while read address bus 791 is for the read address. By providing separate read and write address ports to the memory, this facilitates implementation of a dual-port memory embodiment of the RAM/FIFO block. Also, a single-port memory may also be implemented. Address register 781 provides a write address for RAMs 701 and 702. The write address is the address location where data will be written. Address register 783 provides a read address for RAMs 701 and 702. The read address is the address location where data will be retrieved.

In FIFO mode as when implementing a FIFO, addressing is provided by read pointer latch 703 and write pointer latch 705. Write pointer latch 705 will determine the memory address where data will be stored and read pointer latch 703 will determine the memory address where data will be retrieved. Write pointer latch 705 is coupled to write control logic block 707. Read pointer latch 703 is coupled to read control logic block 713. Write control logic block 707 and read control logic block 713 generate control signals for write pointer latch 705 and read pointer latch 703 to implement a FIFO memory organization by determining and updating the addresses in write and read pointer latches 707 and 703, respectively, each time data is stored or retrieved. Write control logic 707 is similar to write control logic 507 described above. Read control logic 703 is similar to read control logic 503 described above. The address in write pointer latch 705 transfers through multiplexer 775 into address register 781, where it may be clocked or strobed onto write address bus 782. The address in read pointer latch 703 transfers through multiplexer 777 into address register 783, where it may be clocked or strobed onto read address bus 791.

Write control logic 707 is also coupled to RAM 701 and RAM 702 through signal lines 708 and 729. Read control logic block 713 is also coupled to RAMs 701 and 702 through connections 795 and 797. Signal lines 708 and 729 provide a write strobe signal for RAMs 701 and 702. Signal lines 795 and 797 provide a read strobe signal.

Data are stored into RAMs 701 and 702 using input buses 625 and 627, each containing a portion of the maximum memory word. From inputs 625 and 627, data are first placed into input latches 709 and 710, respectively, which in turn are clocked (via a clock signal 721) into RAMs 701 and 702, respectively. Input latches 625 and 627 are similar to input latch 509 of FIG. 5, described above. Furthermore, input latches 709 and 710 may be programmed to operate in one of five modes (described earlier): leading-edge-triggered register, trailing-edge-triggered register, active-high latch, active-low latch, or as a direct combinatorial bypass.

For output, data are retrieved from RAMs 701 and 702 by first placing the data into output latches 715 and 716, then clocking data onto output buses 629, 630, 685, and 687. Output latch 715 outputs data to bus 629. Output latch 716 outputs data to buses 630 and 685. Output latches 715 and 716 are similar to output latch 515 of FIG. 5 described above. As shown in FIG. 6 and described earlier, buses 685 and 687 are routed to output enable buffers 615 and 613, respectively, which are connected to input-output pins 619 and 617, respectively. Buses 629 and 630 are fed back into PIA 203 for programmably coupling to other components of the PLD, which will then be available to drive the logic in the PLD integrated circuit. Outputs from output latches 716 and 715 also input a multiplexer 793. Multiplexer 793 selectively couples the output of latch 716 or 715 to bus 687. Address bus 633 (via connection 792) and read control logic 713 (via connection 794) are used as selection inputs for multiplexer 793. The selection of multiplexer 793 is based on the least significant bits of the address provided by address bus 633 and read control logic 713.

A multiplexer 719 programmably selects a clocking signal 721 for both input latches 709 and 710 and write control logic 707. Programmable selection of multiplexer 719 is controlled by way of user-programmable memory bits (not shown) such as EEPROM cells. Multiplexer 719 programmably selects MEMCLK1 277, global clock 217, or a signal 747 from PIA 203 for the clocking signal 721. MEMCLK1 277 and global clock 217 were described earlier. As for signal 747, a signal programmably connectable to PIA 203 may used. For example, via PIA 203, a LAB 201 may be used to generate signal 747.

A multiplexer 739 programmably selects a clocking signal 743 for both output latches 715 and 716 and read control logic 713. Programmable selection of multiplexer 739 is controlled by way of user-programmable memory bits (not shown) such as EEPROM cells. Multiplexer 739 programmably selects MEMCLK0 275, global clock 217, or a signal 753 from PIA 203 as clock signal 743. MEMCLK0 275 and global clock 217 were described earlier. As for signal 753, a signal programmably connectable to PIA 203 may used to generate this signal. For example, via PIA 203, a LAB 201 may be used to generate signal 753.

As shown in FIG. 6, control signals 259 from PIA 203 input into RAM/FIFO 601 for controlling the operation of RAM/FIFO 601. Control signals 259 of FIG. 6 are similar to control signals 259 of FIG. 2 described above. In the embodiment shown in FIG. 7, there are five control signal inputs: enable write (ENW) 749, enable read (ENR) 755, Clear (CLR) 751, write clock (CKW) 721, and read clock (CKR) 743. These signals are analogous to corresponding ENW 549, ENR 535, CLR 551, CKW 521, and CKR 543 signals described above. ENW 749 is coupled to write control logic 707 for enabling or disabling writing of RAMs 701 and 702. ENR 755 is coupled to read control logic 713 for enabling or disabling reading of RAMs 701 and 702. CKW 721 provides a clock signal for input latches 709 and 710, write address register 781, and write control logic 707. CKR 743 provides a clock signal for output latches 715 and 716, read address register 783, and read control logic 713.

CLR 751 is coupled to reset logic block 717 for controlling whether reset logic block resets and clears the FIFO control blocks and pointers. Reset logic 717 is coupled (not shown) to write pointer latch 705, write control logic 707, read pointer latch 703, and read control logic 713. Responsive to CLR 751, reset logic 717 resets and clears the FIFO control blocks and pointers. For example, in an embodiment, upon powering up of the PLD integrated circuit, reset logic 717 provides a power-on reset of FIFO control blocks and pointers.

A flag logic block 711 generates flags indicating the status of RAM/FIFO 601. Flag logic block 711 is similar to flag logic block 511 of FIG. 5 described above. In the embodiment shown in FIG. 7, flag logic block 711 takes input 706 from write pointer latch 705 and input 735 from read pointer latch 703. Responsive to its inputs, flag logic block 711 generates four flag outputs, full flag 761, almost full flag 763, almost empty flag 765, and empty flag 767. These signals programmably couple to PIA 203, as shown by connection 276 in FIG. 6. Furthermore, these signals are analogous to the corresponding flag signals in FIG. 5 described above (i.e., full flag 561, almost full flag 563, almost empty flag 565, and empty flag 567). In further embodiments of the present invention, there may be additional flag signals for indicating other types of status information.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A programmable logic device integrated circuit comprising:
   a plurality of logic array blocks;
   a programmable interconnect array configurable to interconnect signals between the plurality of logic array blocks; and
   a memory block coupled to the programmable interconnect array, wherein the memory block is configurable as a random access memory in a first mode and a first-in, first-out memory in a second mode, and the mode of the memory block is user-programmable.

2. The programmable logic device integrated circuit of claim 1 wherein the memory block is dual-port memory.

3. The programmable logic device integrated circuit of claim 1 wherein the memory block generates a plurality of signals indicating a status of the memory block.

4. The programmable logic device integrated circuit of claim 3 wherein the memory block comprises a status signal block which generates the plurality of signals.

5. The programmable logic device integrated circuit of claim 3 wherein the plurality of signals includes a first signal indicating that the memory block has a specified number of occupied memory locations.

6. The programmable logic device integrated circuit of claim 5 wherein the specified number of occupied memory locations is user programmable.

7. The programmable logic device integrated circuit of claim 3 wherein the plurality of signals includes a second signal indicating that the memory block has a specified number of unoccupied memory locations.

8. The programmable logic device integrated circuit of claim 7 wherein the specified number of unoccupied memory locations is user programmable.

9. The programmable logic device integrated circuit of claim 1 wherein at least one logic array block from the plurality of logic array blocks is coupled directly to the memory block without passing through the programmable interconnect array.

10. The programmable logic device integrated circuit of claim 1 wherein a width of the memory block is programmably configurable.

11. The programmable logic device integrated circuit of claim 1 wherein a depth of the memory block is programmably configurable.

12. The programmable logic device integrated circuit of claim 1 wherein the memory block comprises a first control input coupled to the plurality of logic array blocks, wherein the first control input is used to control writing of data to the memory block.

13. The programmable logic device integrated circuit of claim 1 wherein the memory block comprises a second control input coupled to the plurality of logic array blocks, wherein the second control input is used to control reading of data from the memory block.

14. The programmable logic device integrated circuit of claim 1 wherein the memory block comprises:
   at least one random access memory;
   a read pointer latch;
   a write pointer latch;
   a read address multiplexer coupled to a read address input of the at least one random access memory; and
   a write address multiplexer coupled to a write address input of the at least one random access memory.

15. The programmable logic device integrated circuit of claim 14 wherein the write address multiplexer couples the programmable interconnect array to the write address input of the at least one random access memory.

16. The programmable logic device integrated circuit of claim 14 wherein the read address multiplexer couples the programmable interconnect array to the read address input of the at least one random access memory.

17. The programmable logic device integrated circuit of claim 14 wherein the memory block further comprises:
   a read control block coupled to the read pointer latch; and
   a write control block coupled to the write pointer latch.

18. The programmable logic device integrated circuit of claim 17 wherein the memory block further comprises:
   an input latch, wherein an output of the input latch is coupled to a data input of the at least one random access memory; and
   an output latch, wherein an input of the output latch is coupled to a data output of the at least one random access memory.

19. The programmable logic device integrated circuit of claim 18 wherein the memory block further comprises a tristate buffer coupled to the output of the output latch, wherein the output of the output latch is programmably coupled to the programmable interconnect array, and wherein an output of the tristate buffer is coupled to an input-output pad of the programmable logic device.

20. The programmable logic device integrated circuit of claim 14 wherein the memory block further comprises a reset logic block coupled to the write pointer latch and the read pointer latch, wherein the reset logic block resets the write pointer latch and the reach pointer latch.

21. The programmable logic device integrated circuit of claim 1 further comprising an address bus multiplexer, wherein the address bus multiplexer selectably couples an input pad of the programmable interconnect array to an address bus of the memory block.

22. The programmable logic device integrated circuit of claim 1 further comprising a data bus multiplexer, wherein the data bus multiplexer selectably couples an input pad of the programmable interconnect array to a data bus of the memory block.

23. A programmable logic device integrated circuit comprising:
   a plurality of logic array blocks;
   a programmable interconnect array configurable to interconnect signals between the plurality of logic array blocks; and
   a memory block programmably coupled to the programmable interconnect array; and
   wherein at least one logic array block from the plurality of logic array blocks is coupled directly to the memory block without passing through the programmable interconnect array.

24. A programmable logic device integrated circuit comprising:
   a plurality of logic array blocks;
   a programmable interconnect array configurable to interconnect signals between the plurality of logic array blocks; and
   a memory block programmably coupled to the programmable interconnect array, wherein the memory block generates a plurality of output signals indicating a status of the memory block.

25. The programmable logic device integrated circuit of claim 24 wherein a word size and a depth size for the memory block are programmably selectable.

26. The programmable logic device integrated circuit of claim 24 wherein the memory block is configurable in a first mode to have a first number of bits width and a second number of bits depth, and in a second mode to have a third number of bits width, which is half the first number of bits width, and a fourth number of bits depth, which is twice the second number of bits depth.

27. The programmable logic device integrated circuit of claim 24 wherein said memory block is a single-port memory.

28. The programmable logic device integrated circuit of claim 24 wherein the programmable interconnect array is coupled to an address bus of the memory block.

29. The programmable logic device integrated circuit of claim 24 wherein the programmable interconnect array is coupled to a data bus of the memory block.

30. The programmable logic device integrated circuit of claim 24 wherein an output bus of the memory block is coupled to the programmable interconnect array.

31. The programmable logic device integrated circuit of claim 24 wherein the memory block is configurable using a user-programmable memory bit.

32. The programmable logic device integrated circuit of claim 31 wherein the user-programmable memory bit is a floating gate device.

33. The programmable logic device integrated circuit of claim 31 wherein the user-programmable memory bit is an antifuse element.

34. The programmable logic device integrated circuit of claim 31 wherein the user-programmable memory bit is an SRAM cell.

35. The programmable logic device integrated circuit of claim 24 further comprising:
   a global clock signal, coupled to at least one of the plurality of logic array blocks and the memory block.

36. The programmable logic device integrated circuit of claim 24 wherein the programmable logic device is configurable by in-system programming.

37. The programmable logic device integrated circuit of claim 24 wherein the memory block further comprises a plurality of control inputs, programmably coupled to the programmable interconnect array, wherein the plurality of control inputs controls operations of the memory block.

38. The programmable logic device integrated circuit of claim 24 further comprising:
   a plurality of input-output blocks, coupled to the plurality of logic array blocks; and
   an output enable signal, programmably coupled to at least one of the plurality of input-output blocks and the memory block.

39. A programmable logic device integrated circuit comprising:
   a plurality of logic array blocks;
   a programmable interconnect array configurable to interconnect signals between the plurality of logic array blocks; and
   a dual-ported memory block coupled to the programmable interconnect array, wherein a word size and a depth size for the memory block are programmably selectable.

40. A programmable logic device integrated circuit comprising:
   a plurality of logic array blocks;
   a programmable interconnect array configurable to interconnect signals between the plurality of logic array blocks; and
   a dual-ported memory block coupled to the programmable interconnect array; and
   wherein the programmable interconnect array is coupled to an address bus of the memory block.

41. A programmable logic device integrated circuit comprising:
   a plurality of logic array blocks;
   a programmable interconnect array configurable to interconnect signals between the plurality of logic array blocks; and
   a dual-ported memory block coupled to the programmable interconnect array; and
   wherein the programmable interconnect array is coupled to a data bus of the memory block.

42. A programmable logic device integrated circuit comprising:
   a plurality of logic array blocks;
   a programmable interconnect array configurable to interconnect signals between the plurality of logic array blocks; and
   a dual-ported memory block coupled to the programmable interconnect array; and
   wherein an output bus of the memory block is coupled to the programmable interconnect array.

43. A programmable logic device integrated circuit comprising:
   a plurality of logic array blocks;
   a programmable interconnect array configurable to interconnect signals between the plurality of logic array blocks;
   a dual-ported memory block coupled to the programmable interconnect array; and
   a global clock signal, coupled to at least one of the plurality of logic array blocks and the memory block.

44. A programmable logic device integrated circuit comprising:
   a plurality of logic array blocks;
   a programmable interconnect array configurable to interconnect signals between the plurality of logic array blocks; and
   a dual-ported memory block coupled to the programmable interconnect array, the memory block comprising a plurality of control inputs programmably coupled to the programmable interconnect array, wherein the plurality of control inputs controls operations of the memory block.

45. A programmable logic device integrated circuit comprising:
   a plurality of logic array blocks;
   a programmable interconnect array configurable to interconnect signals between the plurality of logic array blocks; and
   a dual-ported memory block coupled to the programmable interconnect array; and
   wherein at least one logic array block of the plurality of logic array blocks is coupled directly to, without passing through the programmable interconnect array, a plurality of control inputs for the memory block.

46. A programmable logic device integrated circuit comprising:
   a plurality of logic array blocks;
   a programmable interconnect array configurable to interconnect signals between the plurality of logic array blocks; and
   a dual-ported memory block coupled to the programmable interconnect array; and
   wherein the memory block generates a plurality of signals indicating a status of the memory block.

47. A programmable logic device integrated circuit comprising:
   a plurality of logic array blocks;
   a programmable interconnect array configurable to interconnect signals between the plurality of logic array blocks;
   a dual-ported memory block coupled to the programmable interconnect array; and
   a crossbar switch, coupled between the memory block and the programmable interconnect array.

48. A programmable logic device integrated circuit comprising:
   a plurality of logic array blocks;
   a programmable interconnect array configurable to interconnect signals between the plurality of logic array blocks;
   a dual-ported memory block coupled to the programmable interconnect array;

a plurality of input-output blocks, coupled to the plurality of logic array blocks; and an output enable signal, programmably coupled to at least one of the plurality of input-output blocks and the memory block.

49. A programmable logic device integrated circuit comprising:

a plurality of logic array blocks;

a programmable interconnect array configurable to interconnect signals between the plurality of logic array blocks;

a dual-ported memory block coupled to the programmable interconnect array; and a global clock, coupled to the plurality of logic array blocks and the memory block.

50. A programmable logic device integrated circuit comprising:

a plurality of logic array blocks;

a programmable interconnect array configurable to interconnect signals between the plurality of logic array blocks;

a dual-ported memory block coupled to the programmable interconnect array;

a first memory clock, coupled to the memory block; and a second memory clock, coupled to the memory block.

51. A programmable logic device integrated circuit comprising:

a plurality of logic array blocks;

a programmable interconnect array configurable to interconnect signals between the plurality of logic array blocks; and a dual-ported memory block coupled to the programmable interconnect array; and wherein the programmable interconnect array is programmably coupled to the memory block through a plurality of fully populated multiplexers.

52. A programmable logic device integrated circuit comprising:

a plurality of logic array blocks;

a programmable interconnect array configurable to interconnect signals between the plurality of logic array blocks; and a dual-ported memory block coupled to the programmable interconnect array; and wherein the programmable interconnect array is programmably coupled to the memory block through a plurality of partially populated multiplexers.

* * * * *